United States Patent
Torazawa et al.

(10) Patent No.: US 12,037,193 B2
(45) Date of Patent: Jul. 16, 2024

(54) WAFER DELIVERY DEVICE, WAFER STORAGE CONTAINER, AND WAFER STORAGE SYSTEM

(71) Applicant: MURATA MACHINERY, LTD., Kyoto (JP)

(72) Inventors: Masayoshi Torazawa, Inuyama (JP); Yoichi Nakamura, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 321 days.

(21) Appl. No.: 17/635,406

(22) PCT Filed: Aug. 4, 2020

(86) PCT No.: PCT/JP2020/029897
§ 371 (c)(1),
(2) Date: Feb. 15, 2022

(87) PCT Pub. No.: WO2021/044791
PCT Pub. Date: Mar. 11, 2021

(65) Prior Publication Data
US 2022/0289483 A1 Sep. 15, 2022

(30) Foreign Application Priority Data
Sep. 2, 2019 (JP) ................. 2019-159877

(51) Int. Cl.
*H01L 21/673* (2006.01)
*B65G 1/04* (2006.01)
*B65G 1/10* (2006.01)
*B65G 49/06* (2006.01)

(52) U.S. Cl.
CPC ............ *B65G 1/10* (2013.01); *B65G 1/0464* (2013.01); *B65G 49/061* (2013.01); *B65G 49/062* (2013.01); *B65G 2201/0297* (2013.01)

(58) Field of Classification Search
CPC ................................. H01L 21/67346
See application file for complete search history.

(56) References Cited

U.S. PATENT DOCUMENTS 7,854,327 B2* 12/2010 Hyobu ............ H01L 21/67294
206/509
9,144,901 B2* 9/2015 Yang ................ H01L 21/673
(Continued)

FOREIGN PATENT DOCUMENTS

JP 2005-142443 A 6/2005
JP 2005-311038 A 11/2005
(Continued)

OTHER PUBLICATIONS

Official Communication issued in corresponding Singaporean Patent Application No. 11202200825P, mailed on Apr. 13, 2023.
(Continued)

*Primary Examiner* — Jonathan Snelting
(74) *Attorney, Agent, or Firm* — Keating & Bennett, LLP

(57) ABSTRACT

In a wafer storage container, a first ring and a second ring are stacked alternatively in a vertical direction. A wafer delivery device is provided with a first ring support and a second ring support. The first ring support includes a first support piece fixed at the vertical position and a first driving mechanism to drive the first support piece. The first driving mechanism is selectively switchable among a first state, a second state, and a third state. In the first state, the first support piece overlaps with the first position in a plan view. In the second state, the first support piece overlaps with the second position in a plan view. In the third state, the first support piece does not overlap with the first and the second positions in a plan view.

14 Claims, 19 Drawing Sheets

(56) References Cited

U.S. PATENT DOCUMENTS

| | | | |
|---|---|---|---|
| 10,403,526 B2* | 9/2019 | Schober | H01L 21/67383 |
| 10,818,530 B1* | 10/2020 | Atamny | H01L 21/6732 |
| 11,361,981 B2* | 6/2022 | Patel | H01L 21/68 |
| 2006/0151404 A1 | 7/2006 | Blattner et al. | |
| 2010/0179681 A1 | 7/2010 | Jäger et al. | |
| 2018/0122674 A1 | 5/2018 | Dovids et al. | |
| 2019/0019704 A1* | 1/2019 | Gallagher | H01L 21/67369 |
| 2019/0074203 A1 | 3/2019 | Schober et al. | |
| 2021/0296149 A1* | 9/2021 | Green | H01L 21/67346 |

FOREIGN PATENT DOCUMENTS

| | | |
|---|---|---|
| JP | 2007-197214 A | 8/2007 |
| JP | 2009-500256 A | 1/2009 |
| JP | 2009-029604 A | 2/2009 |
| JP | 4751827 B2 | 8/2011 |
| JP | 5564178 B2 | 7/2014 |
| WO | 2014/107818 A2 | 7/2014 |

OTHER PUBLICATIONS

Official Communication issued in International Patent Application No. PCT/JP2020/029897, mailed on Mar. 17, 2022.
English translation of Official Communication issued in International Patent Application No. PCT/JP2020/029897, mailed on Oct. 20, 2020.
Official Communication issued in International Patent Application No. PCT/JP2020/029897, mailed on Oct. 20, 2020.

* cited by examiner

FIG. 14A
FIG. 14B
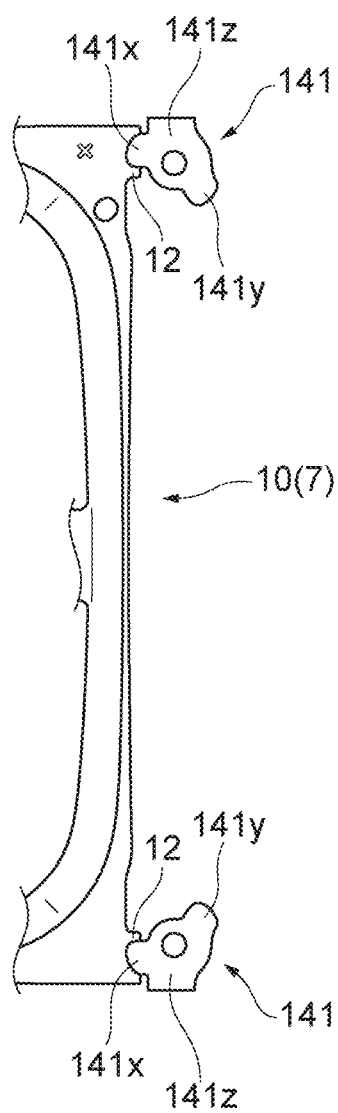
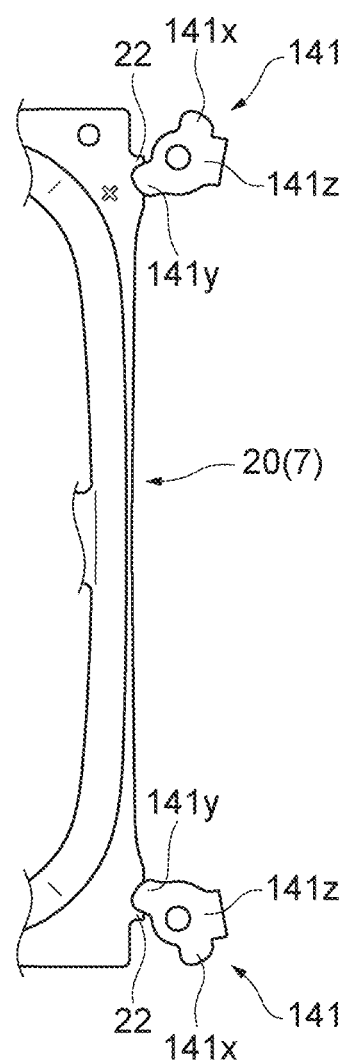

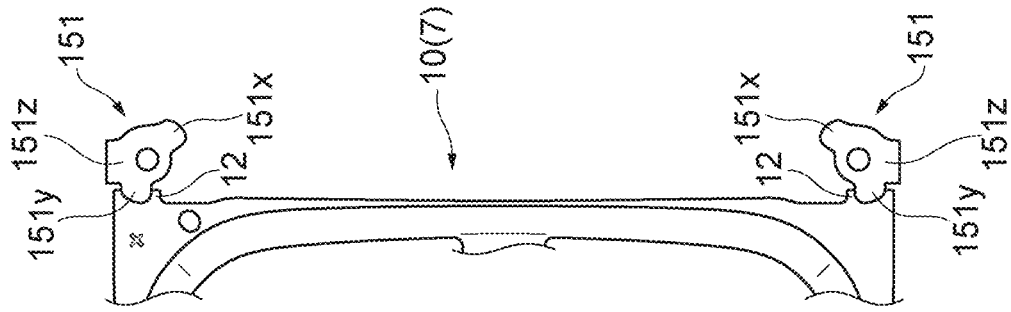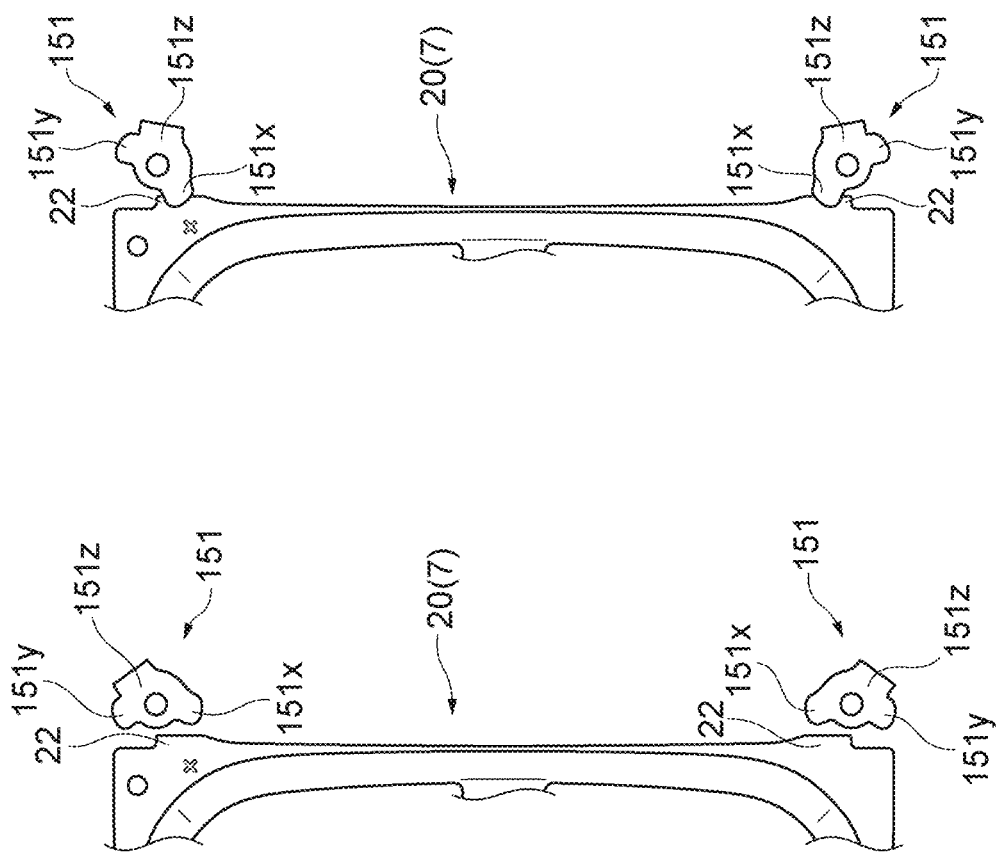

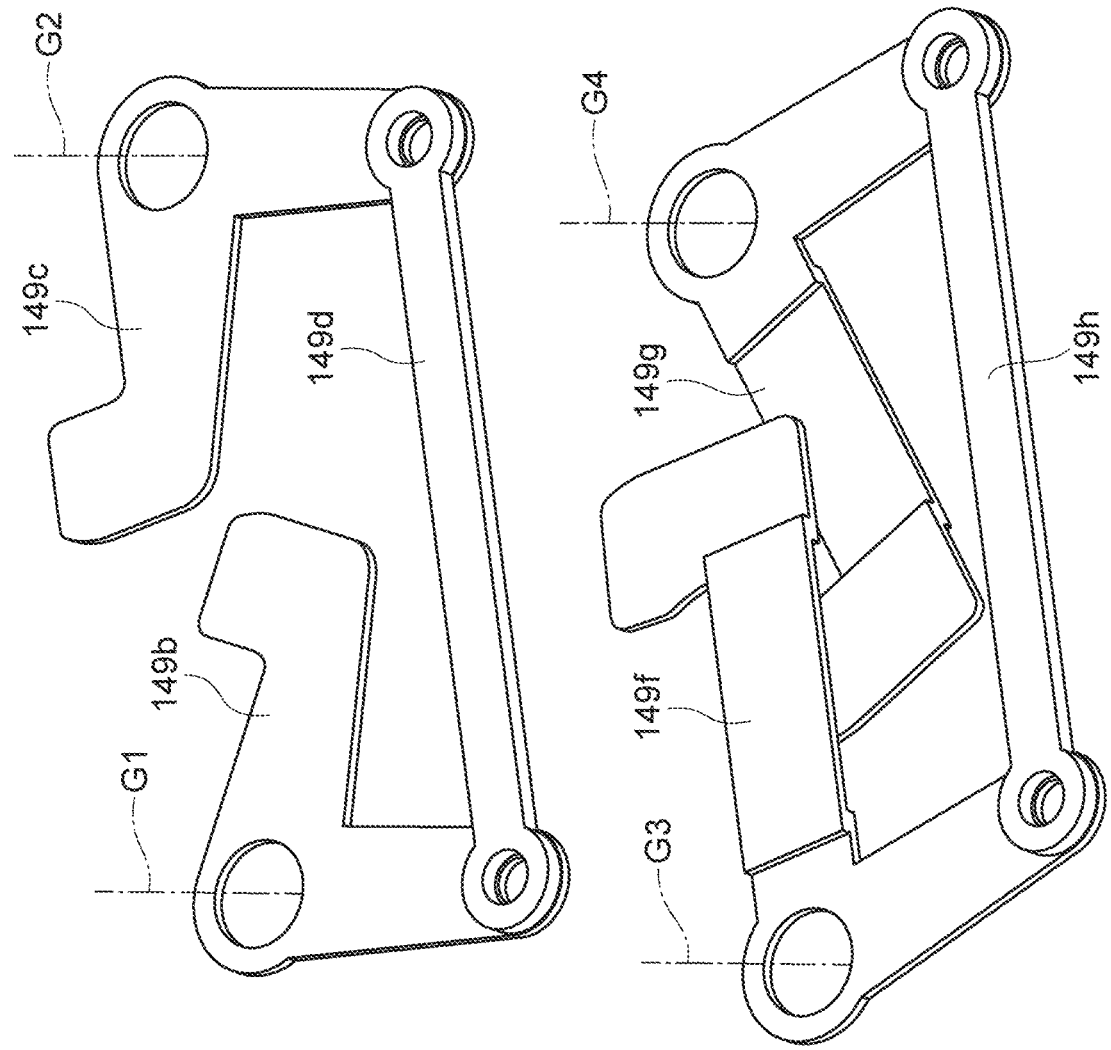

WAFER DELIVERY DEVICE, WAFER STORAGE CONTAINER, AND WAFER STORAGE SYSTEM

BACKGROUND OF THE INVENTION

1. Field of the Invention

The present invention relates to a wafer delivery device, a wafer storage container and a wafer storage system.

2. Description of the Related Art

A wafer delivery device to deliver a wafer from/to a wafer storage container including a plurality of rings with a holding element for holding a wafer is known. The plurality of rings are vertically stacked in the wafer storage container (for example, Japanese Patent No. 4751827).

SUMMARY OF THE INVENTION

In the wafer delivery device according to Japanese Patent No. 4751827, when delivering a wafer from/to any of a plurality of rings vertically stacked, a support piece that supports the rings needs to be moved up or down and the rings also need to be moved in a circumferential direction in accordance with the position of a supported element provided at a different position for each of the rings. Therefore, the structure of such a wafer delivery device is complicated. The supported elements of the vertically adjacent rings are misaligned in a circumferential direction, so that, if the vertical position of the support piece is fixed at a predetermined position in order to simplify the structure of the wafer delivery device, the wafer delivery device may be unable to deliver the wafer from/to each of a plurality of rings at the same height.

Preferred embodiments of the present invention provide wafer delivery devices, wafer storage containers and wafer storage systems, each capable of delivering a wafer at a same height from/to each of a plurality of rings stacked in a vertical direction.

A wafer delivery device according to a preferred embodiment of the present invention delivers wafers from/to a wafer storage container including a plurality of rings that include wafer holding elements to hold a wafer. The wafer storage container includes a first ring and a second ring. The first ring includes a first supported element at a first position in a plan view, and a first wafer holding element to hold the wafer above the first supported element, and the second ring includes a second supported element at a second position different from the first position in a plan view, and a second wafer holding element to hold the wafer above the second supported element. The first ring and the second ring are stacked alternately and vertically, and the first wafer holding element of the first ring is located above the second supported element of the second ring located above and adjacent to the first ring and the second wafer holding element of the second ring is located above the first supported element of the first ring located above and adjacent to the second ring. The wafer delivery device includes a first ring support to support the ring, a second ring support to support another ring located above and adjacent to the ring at the position above the wafer holding element of the ring supported with the first ring support, an elevating platform on which the wafer storage container is to be placed and being vertically movable, and a wafer delivery device to deliver the wafer to/from the ring supported with the first ring support. The first ring support includes a first support piece, which is fixed at a position in a vertical direction and movable in a plan view, and a first driving mechanism to drive the first support piece. The first driving mechanism is selectively switchable among a first state, a second state, and a third state. In the first state, the first support piece is advanced to a position overlapping with the first position and not overlapping with the second position in a plan view and in the second state, the first support piece is advanced to a position overlapping with the second position and not overlapping with the first position in a plan view and in the third state, the first support piece is retreated to a position not overlapping with the first and second positions in a plan view.

When delivering a wafer from/to any of a plurality of rings, the wafer delivery device allows the ring to be supported at the same height by the first ring support. Therefore, the wafer delivery device is capable of delivering a wafer at a same height from/to any of a plurality of the rings. In other words, the wafer delivery device allows a wafer to be delivered at the same height from/to each of a plurality of the rings stacked in a vertical direction.

The first support piece of the wafer delivery device according to a preferred embodiment of the present invention may include a first claw that overlaps with the first position in a plan view in the first state and does not overlap with the first position in a plan view in the second state, and a second claw located at a same position as the first claw in a vertical direction, and does not overlap with the second position in a plan view in the first state and overlaps with the second position in a plan view in the second state. The first support piece may include two claws.

The first claw and the second claw of the wafer delivery device according to a preferred embodiment of the present invention may be integral defining a unitary structure and supported rotatably about a drive axis. This achieves a simplified structure of the device without a link mechanism.

The first claw and the second claw of the wafer delivery device according to a preferred embodiment of the present invention may be separate structures to be independently advanced and retreated by a link mechanism. This easily avoids interference of the first claw and the second claw with other components.

The first ring support of the wafer delivery device according to a preferred embodiment of the present invention may include a plurality of the first support pieces and a single one of the first driving mechanism. The first driving mechanism may include a mechanism to cause a plurality of the first support pieces to work together and move in response to a driving force from the mechanism. This reduces the number of the first driving mechanisms to be required.

The first ring support of the wafer delivery device according to a preferred embodiment of the present invention may include a plurality of the first support pieces and a plurality of the first driving mechanisms. Each of a plurality of the first driving mechanisms may drive each of a plurality of the first support pieces. This eliminates a link mechanism, thus simplifying the structure of the device.

The second ring support of the wafer delivery device according to a preferred embodiment of the present invention may include a second support piece that is located above the first support piece and movable in a plan view, and a second driving mechanism to drive the second support piece. The second driving mechanism causes the second support piece to advance to a position that overlaps with the second position and does not overlap with the first position in the first state in a plan view, the second driving mechanism causes the second support piece to advance to a position that overlaps with the first position and does not overlap with the second position in the second state in a plan view, and the second driving mechanism causes the second support piece to retreat to a position that does not overlap with the first position and the second position in the third state in a plan view. The configuration that allows the second support piece to advance or retreat realizes the function to support the ring with the second ring support.

The second support piece of the wafer delivery device according to a preferred embodiment of the present invention may include two claws, a third claw and a fourth claw. For example, the third claw overlaps with the second position in a plan view in the first state, and the fourth claw overlaps with the first position in a plan view in the second state. In the first state, the second support piece may be located at the same position as the third claw in the vertical direction.

The third claw and the fourth claw of the wafer delivery device according to a preferred embodiment of the present invention may be integral defining a unitary structure and supported rotatably about a drive axis. This simplifies the mechanism.

The third claw and the fourth claw of the wafer handling device according to a preferred embodiment of the present invention may be separate structures to be independently advanced and retreated by a link mechanism. This easily avoids the interference of the third claw and the fourth claw with other components.

The second ring support of the wafer delivery device according to a preferred embodiment of the present invention may include a plurality of the second support pieces and a single one of the second driving mechanism. The second driving mechanism may include a mechanism that allows a plurality of the second support pieces to work together and move by use of the driving force. This reduces the number of the second driving mechanisms required.

The second ring support of the wafer delivery device according to a preferred embodiment of the present invention may include a plurality of the second support pieces and a plurality of the second driving mechanisms. Each of the plurality of the second driving mechanisms may drive each of the plurality of the second support pieces. This achieves simplified mechanisms without a link mechanism.

The wafer delivery device according to a preferred embodiment of the present invention is provided with a plurality of partially opening and closing modules including the first and second ring supports. Each of the first ring supports included in each of the plurality of partially opening and closing modules may support any different rings from each other of the plurality of stacked rings. With this configuration, wafers can be delivered at multiple positions and each of these positions can be fixed at a predetermined height.

A wafer storage container according to a preferred embodiment of the present invention is a container from/to the wafer delivery device delivers a wafer. As described above, when the wafer delivery device delivers the wafer from/to the wafer storage container, the wafer is delivered from/to each of the plurality of vertically stacked rings at the same height.

The wafer storage system according to a preferred embodiment of the present invention includes the wafer delivery device, a stocker to store the wafer storage container, and a crane to move the wafer storage container between the stocker and the wafer delivery device. As the above, including the wafer delivery device in this wafer storage system enables the wafer to be delivered from/to each of the plurality of vertically stacked rings at the same height.

Preferred embodiments of the present invention provide wafer delivery devices, wafer storage containers and wafer storage systems, which are each capable of delivering a wafer at the same height from/to each of a plurality of rings stacked in a vertical direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 14A is a plan view illustrating a first support piece of FIG. 8 in a first state. FIG. 14B is a plan view illustrating the first support piece of FIG. 8 in a second state.

FIG. 15A is a plan view illustrating a second support piece of FIG. 8 in a neutral state. FIG. 15B is a plan view illustrating the second support piece of FIG. 8 in a first state.

FIG. 15C is a plan view illustrating the second support piece of FIG. 8 in a second state.

FIG. 19A is a plan view illustrating a first support piece according to a variation of a preferred embodiment of the present invention. FIG. 19B is a plan view illustrating a first support piece according to another variation of a preferred embodiment of the present invention.

DETAILED DESCRIPTION OF THE PREFERRED EMBODIMENTS

Figure 1:
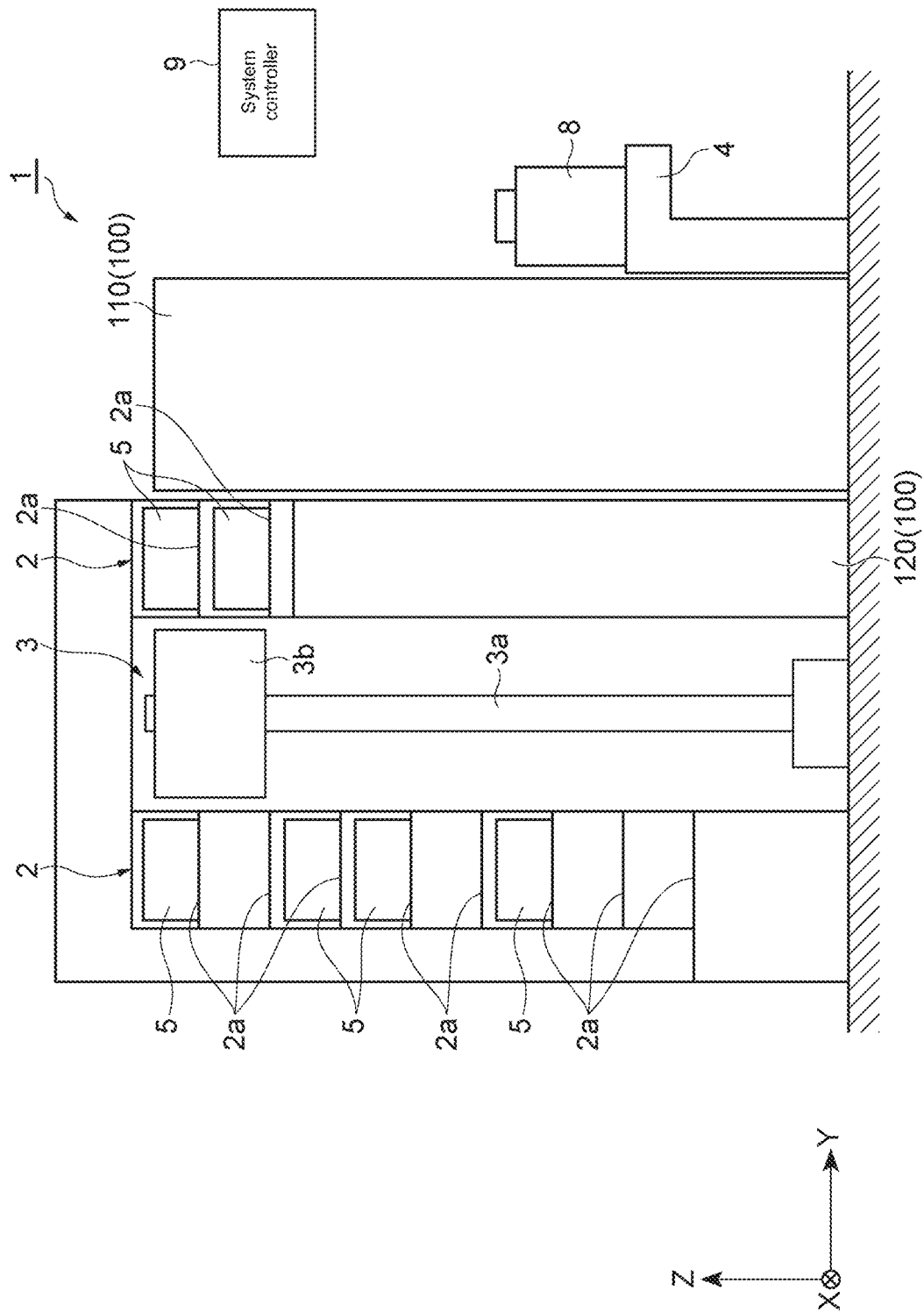
FIG. 1 is a schematic side view illustrating a wafer storage system according to a preferred embodiment of the present invention.

The preferred embodiments of the present invention and variations thereof will be described hereinafter in detail with reference to the drawings. The same or practically the same components are denoted by the same characters in the drawings so as to avoid a repeated explanation.

With reference to FIG. 1, a wafer storage system 1 includes a wafer delivery device 100, stockers 2, a crane 3, a port 4, and a system controller 9. Hereinafter, the word "UP" means towards or in a higher position in a vertical direction, and the word "DOWN" means towards or in a lower position in a vertical direction. X direction is a horizontal direction and Y direction is another horizontal direction perpendicular to X direction, and Z direction is a vertical direction.

The stocker 2 stores wafer storage containers 5. The stocker 2 is provided with a plurality of shelves 2a. The plurality of shelves 2a on which the wafer storage containers 5 are placed extend in an X direction and a Z direction. The stockers 2 are installed in a plurality of rows (for example, two rows in the present preferred embodiment), for example, facing each other in Y direction. With reference to the drawing, one of the stockers 2 is, for example, arranged above a ring opener 120 of the wafer delivery device 100. The crane 3 carries the wafer storage container 5. The crane 3 transfers the wafer storage container 5 between the shelves 2a and the ring opener 120. The crane 3 is arranged in the area between the stockers 2 facing each other. The crane 3 travels on a traveling rail (not shown) disposed along the X direction on a floor. The crane 3 includes a guide rail 3a extending in the Z direction and an elevating platform 3b capable of moving up and down along the guide rail 3a.

The wafer delivery device 100 is provided with a wafer handling robot 110 and the ring opener 120. The details of the wafer handling robot 110 and the ring opener 120 will be described later. The port 4 is capable of delivering a FOUP (Front Opening Unified Pod) 8 between a carriage or a worker and the wafer storage system 1. The carriage travels along the rail installed in the ceiling of a semiconductor factory to transport the FOUP 8. The carriage is an Overhead Hoist Transport capable of carrying the FOUP 8. The carriage is also referred to as a vehicle (transport vehicle), an overhead travel vehicle (overhead transport vehicle) or a travel vehicle. A worker may carry and put the FOUP 8 into the wafer storage system 1 or receive the FOUP 8 carried out from the wafer storage system 1. The FOUP 8, which includes a box-shaped chassis having an opening and a door to cover the opening, is placed on the port 4 by the carriage or a worker. The door is detachable from the chassis. One or more wafers are accommodated within the FOUP 8.

The system controller 9 configured or programmed to control each operation of the wafer storage system 1 is an electronic control unit including CPU (Central Processing Unit), ROM (Read Only Memory), RAM (Random Access Memory). The system controller 9 may be implemented in software such as a computer program stored in ROM, loaded onto RAM, and executed through a CPU, or hardware such as an electronic circuit. The system controller 9 may be made of a single device or a plurality of devices such that one system controller 9 is logically constructed by linking the plurality of devices through a communication network such as the Internet or an Intranet.

Procedures to transfer wafers to the FOUP 8 from the wafer storage container 5 stored in the stockers 2 in the wafer storage system 1 will be described. For example, the FOUP 8 is placed on the port 4 by a carriage or a worker. The crane 3 moves the wafer storage container 5 to the ring opener 120 from the shelve 2a of the stockers 2. The ring opener 120 opens the wafer storage container 5 so as to take out a wafer from the wafer storage container 5 and opens the door of FOUP 8. The wafer handling robot 110 takes out wafers from the wafer storage container 5 and places the wafers into the FOUP 8. The predetermined number of wafers are put into the FOUP 8 and then the door of the FOUP 8 is closed. The transfer of the wafers from the wafer storage container 5 to the FOUP 8 is now completed. The above described steps can be performed conversely to transfer wafers from the FOUP 8 to the wafer storage container 5. In the wafer storage system 1, wafers are automatically transferred between the wafer storage container 5 and the FOUP 8.

The details of the wafer delivery device 100 will be described as follows.

The wafer delivery device 100 for delivering a discoid wafer being a material for a semiconductor element from/to the wafer storage container 5 includes the wafer handling robot 110 and the ring opener 120.

Figure 2:
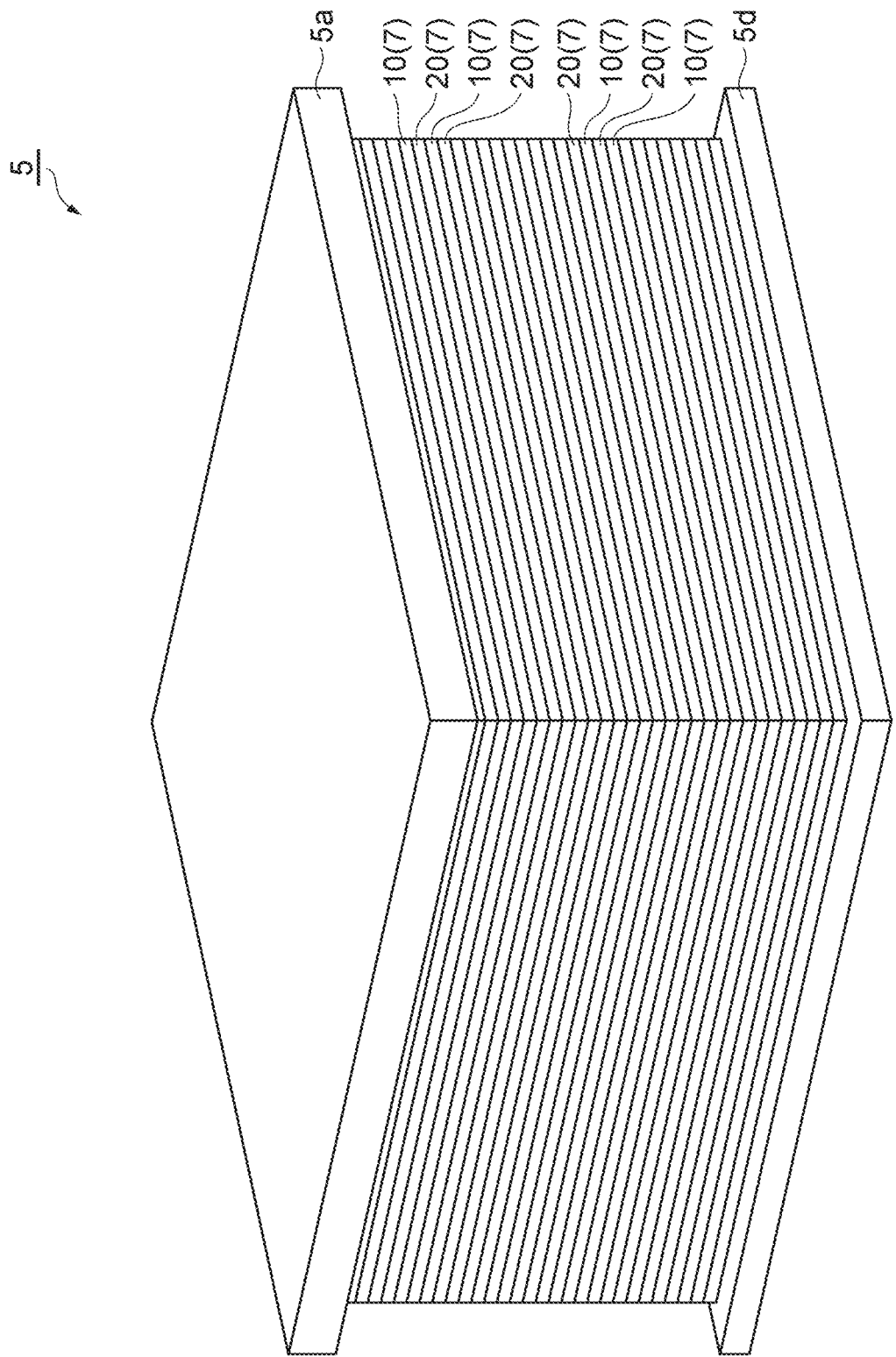
FIG. 2 is a schematic perspective view illustrating a wafer storage container according to a preferred embodiment of the present invention.
Figure 3A:
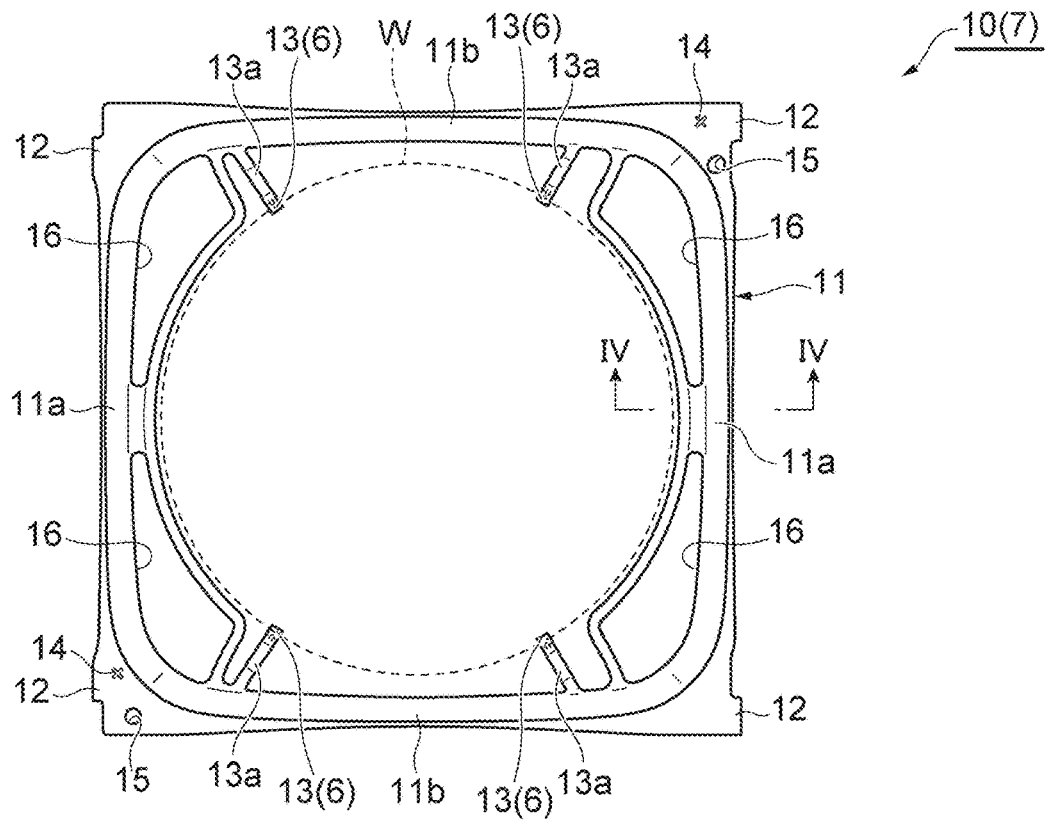
FIG. 3A is a plan view illustrating a first ring of FIG. 2.
Figure 3B:
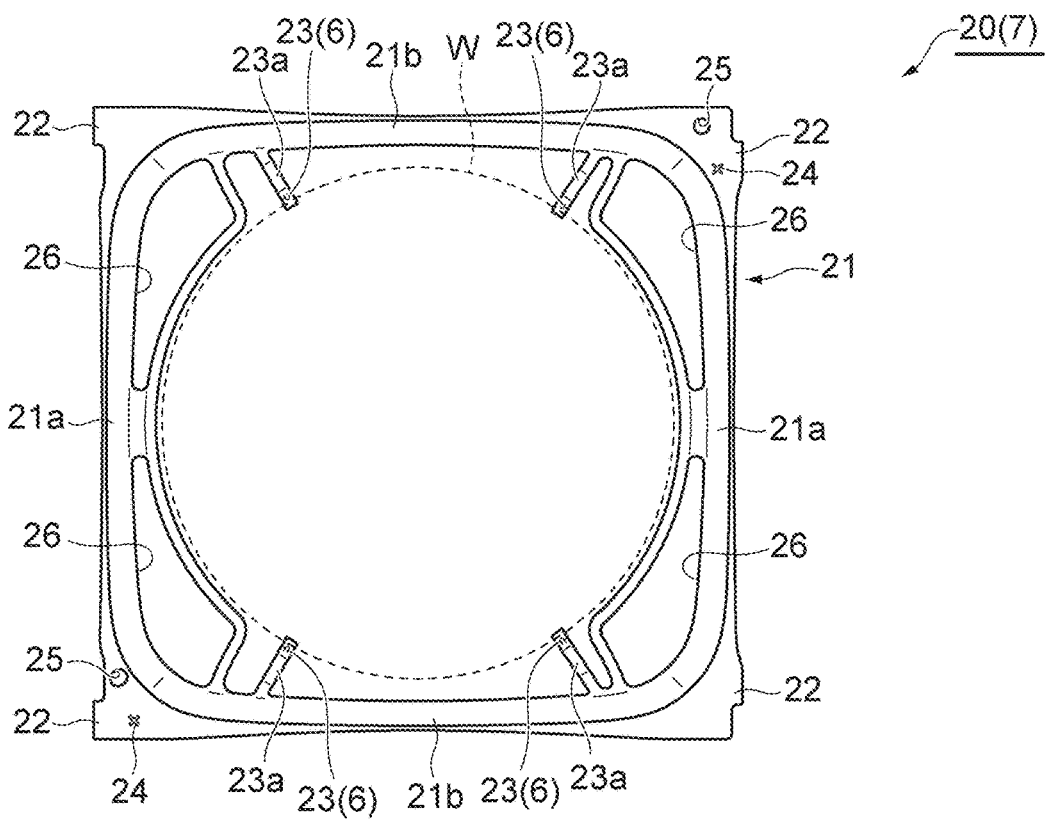
FIG. 3B is a plan view illustrating a second ring of FIG. 2.

The wafer storage container 5 is used for the wafer delivery device 100 to deliver wafers. As shown in FIGS. 2, 3A, and 3B, the wafer storage container 5 is provided with a plurality of rings 7 including holding elements 6 to hold a wafer W. Each of the rings 7 includes a tray to hold the wafer W thereon. Each of the rings 7 includes a plurality of first rings 10 and a plurality of second rings 20, and the first rings 10 and the second rings 20 are alternately stacked vertically. Preferably, the second ring 20 may be the same as the first ring 10. In this case, the first rings 10 rotated by 180 degrees (point symmetry) are used instead of the second rings 20, and they are stacked alternately. The ring 7 is also referred to as a "cell".

As shown in FIG. 2, the wafer storage container 5 includes the rings 7 stacked almost without any gap in order to seal the side surfaces of the plurality of the rings as much as possible, a top plate 5a arranged above a plurality of the stacked rings 7, and a bottom plate 5d on which the plurality of stacked rings 7 are placed. The top plate 5a and the bottom plate 5d are, for example, plate-shaped components. The plurality of stacked rings 7 are pressed down by the weight of the top plate 5a.

As shown in FIG. 3A, the first ring 10 includes an outer ring frame 11, first supported elements 12, first holding elements 13, engagement protrusions 14 and engagement holes 15. The outer ring frame 11 having a rectangular plate-frame shape in a plan view includes a pair of frame webs 11a and a pair of frame webs 11b orthogonal to the frame webs 11a. "A plan view" means a viewpoint viewed from above or underneath (Z direction).

The first supported elements 12 are configured to be supported by the ring opener 120. The first supported elements 12 include a protrusion extending (protruding) outward at the outer side of each of the pair of frame webs 11a in a plan view. The first supported element 12 is located at a first position in a plan view. Specifically, two of the first supported elements 12 (four first supported elements 12 in total, for example) are disposed at both edges of each of the pair of frame webs 11a. Two of the first supported elements 12 are provided at regions (corners) including the edges of the frame web 11a at one of the pair of frame webs 11a. On the other hand, two of the first supported elements 12 are provided at a region (e.g., a region spaced away from the corner) spaced away in a predetermined distance from the edges at the other of the pair of frame webs 11a. Hereinafter, each position of the first supported elements 12 of the first ring 10 in a plan view is referred to as "a first position".

Figure 4:
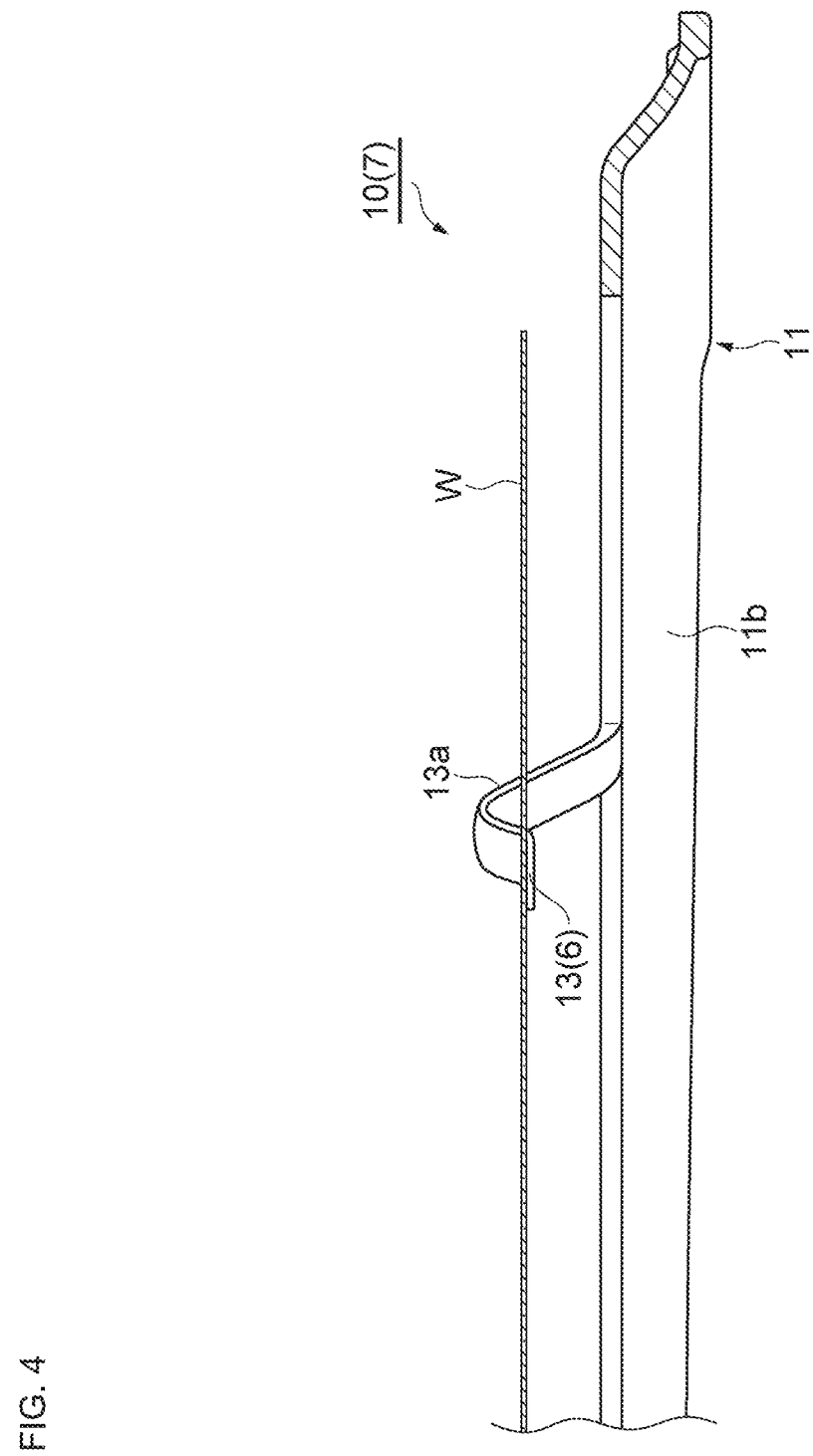
FIG. 4 is a sectional view along IV-IV line of FIG. 3A.

As shown in FIGS. 3A and 4, the first holding elements 13, which are holding elements 6 of the first ring, are disposed at the top edges of arms 13a connected to each inside of a pair of the frame webs 11b so as to hold the wafer W above the first supported elements 12. Two each (four in total, for example) of the arms 13a are arranged at the inner side of each of the pair of frame webs 11b of the first ring and extend upward to the center of the first ring 10 from the arm-attached-positions in a plan view and further, the distal ends of the arms curve and extend downwards. The first holding elements 13 extend horizontally from the digital ends of the arms 13a, which enables the wafer W to be held over four of the first holding elements 13.

Figure 5:
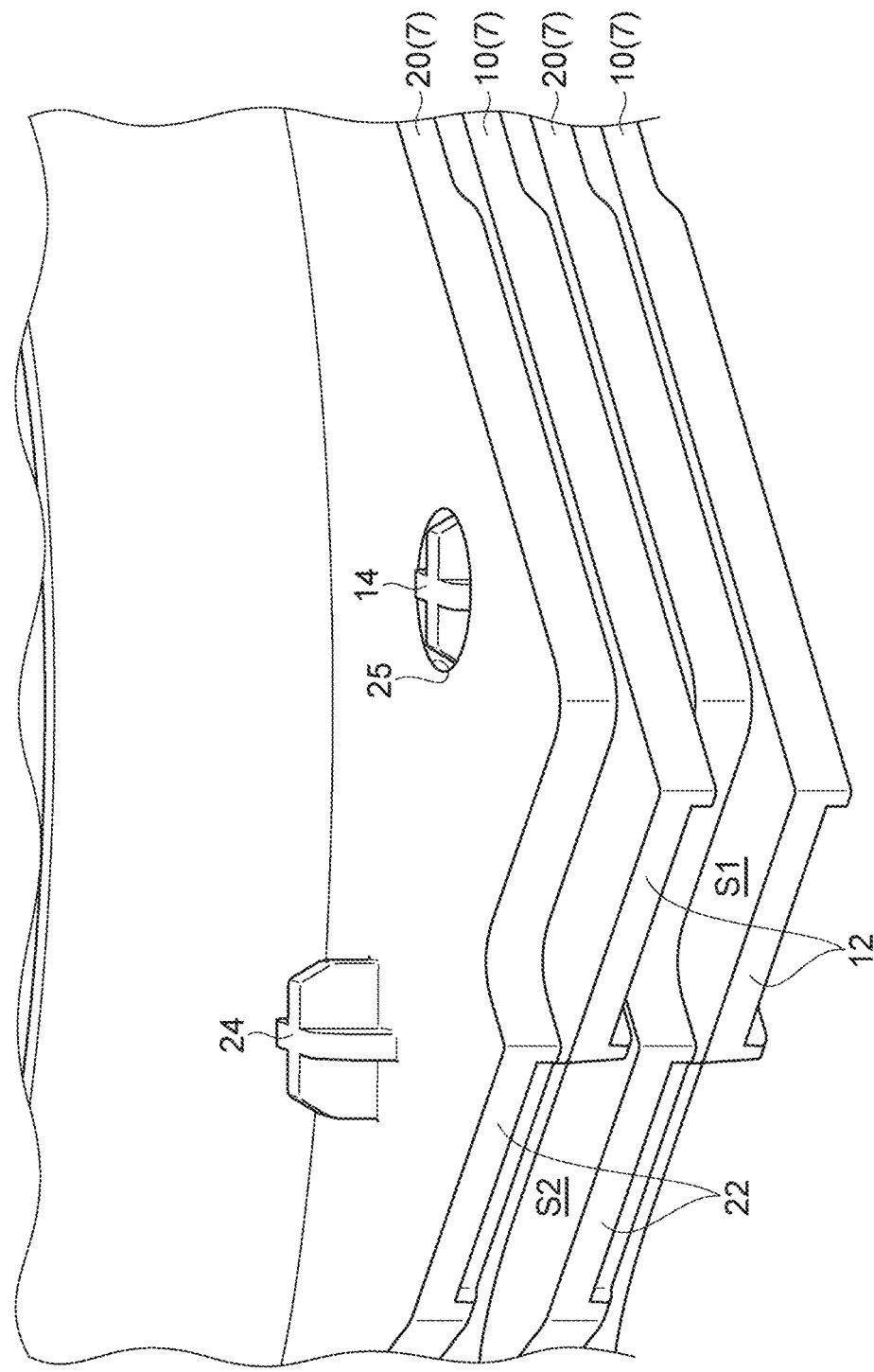
FIG. 5 is a perspective view illustrating a plurality of stacked rings.

As shown in FIGS. 3A and 5, for example, each of the engagement protrusions 14 of the first ring is provided at each of a pair of the diagonal corners on the upper surface of the outer ring frame 11 so as to protrude upwards. The engagement holes 15 extend through the circumstance of the engagement protrusions 14 at the corners of the outer ring frame 11. For example, the engagement protrusions 14 of the first ring are inserted in engagement holes 25 of the above adjacent second ring 20, which define ventilation spaces 16 communicating with the edge sides within the outer ring frame 11 of the first ring 10 and the edge sides of the outer ring frame of the above adjacent second ring 20.

As shown in FIG. 3B, for example, the second ring 20 includes an outer ring frame 21, second supported elements 22, second holding elements 23, engagement protrusions 24 and engagement holes 25. The outer ring frame 21 preferably has a rectangular plate-frame shape in a plan view and includes a pair of frame webs 21a and a pair of frame webs 21b orthogonal to the pair of frame webs 21a.

The ring opener 120 supports the first ring or the second ring at the second supported elements 22 extending outward in a plan view from the respective outer sides of the pair of frame webs 21a. When the first ring 10 and the second ring 20 are stacked (hereinafter, simply referred to as "in a stacked state"), the second supported elements 22 are disposed at a second position different from the first position in a plan view. Specifically, two each of the second supported elements 22 (four in total, for example) are provided at the both edges of each of a pair of the frame webs 21a. The pair of second supported elements 22 on the both edges of one of the pair of frame webs 21a are provided at the area (e.g., an area spaced away from the vertex) spaced away from the associated edges of the frame web 21a in a predetermined distance, and the pair of the second supported elements 22 on the both edges of the other of a pair of the frame webs 21a are provided at the area (corner area) including the associated edges of the frame web 21a. Hereinafter, each position of the second supported elements 22 of the second ring 20 in a plan view is defined as a "second position".

The second holding elements 23, which are a plurality of the holding elements 6 of the second ring, are disposed at the top edges of arms 23a connected to each inside of a pair of the frame webs 21b so as to hold the wafer W above the second supported elements 22. Two each (four in total, for example) of the arms 23a are arranged at the inner side of each of a pair of the frame webs 21b of the second ring and extend upward to the center of the second ring 20 from the arm-attached-positions in a plan view, and the distal ends of the arms curve and extend downwards. The second holding elements 23 extend horizontally from the digital ends of the arms 23a. This enables the wafer W to be held over four of the second holding elements 23. In a stacked state, the second holding elements 23 and the arms 23a are arranged at the positions that do not overlap with the first holding elements 13 and the arms 13a in a plan view.

As shown in FIGS. 3B and 5, each of the engagement protrusions 24 of the second rings 20 are provided on the upper surface of each of a pair of the corners diagonally to the outer ring frames 21 so as to protrude upwards. The engagement protrusions 24 are located at the position corresponding to the engagement holes 15 of the first ring 10 when the first ring is stacked just above the second ring, so that the engagement protrusions 24 will be inserted in the engagement holes 15 of the above stacked first ring 10. The engagement holes 25 of the second ring are through-holes located around the engagement protrusions 24 of the outer frame ring 21. The engagement holes 25 are located at positions corresponding to the engagement protrusions 14 of the first ring 10 when the second ring is stacked on the first ring, so that the engagement protrusions 14 of the below adjacent first ring will be inserted into the engagement holes 25. When the first rings and the second rings are stacked on each other, the engagement protrusions 14 of the below adjacent first ring 10 are inserted into the engagement holes 25 and the engagement protrusions 24 of the below adjacent second ring 20 are inserted into the engagement holes 15, respectively. These engagements of the engagement protrusions 14, 24 with the engagement holes 15, 25 determine the appropriate positions of the first ring 10 and the second ring 20 without any horizontal misalignment. Ventilation spaces 26 to communicate the adjacent first ring 10 are located at the edges of the outer ring frame 21 of the second rings 20.

Figure 6A:
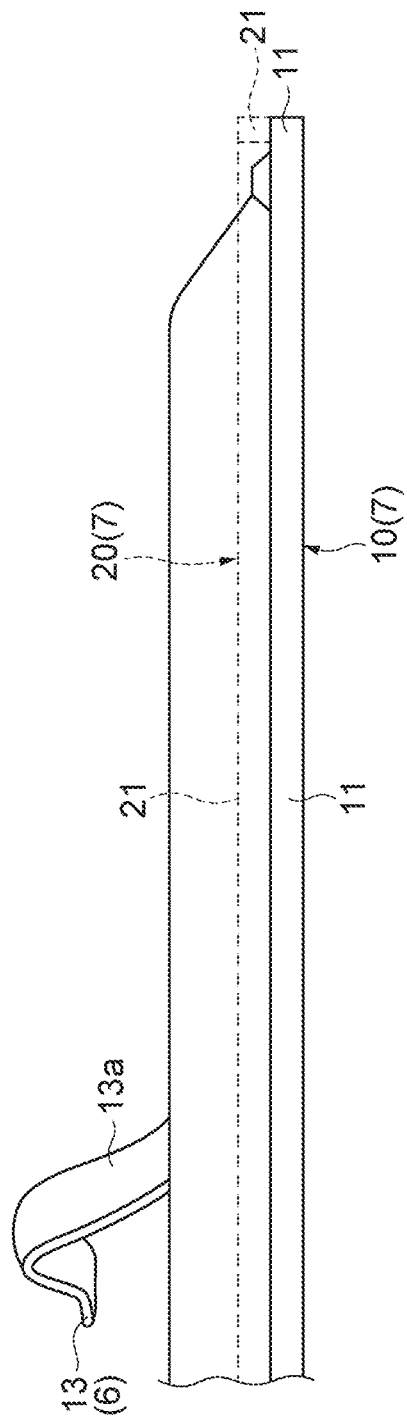
FIG. 6A is a side view illustrating a first ring of FIG. 2.
Figure 6B:
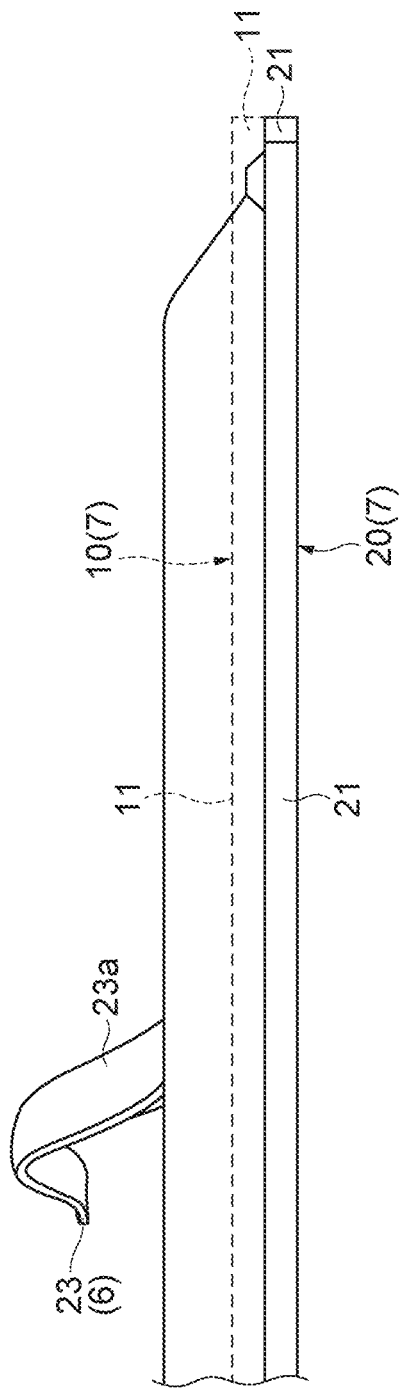
FIG. 6B is a side view illustrating a second ring of FIG. 2.

As shown in FIGS. 3A, 3B and 6A, in the stacked state, the first holding elements 13 and the arms 13a of the first ring 10 are located within the outer ring frame 21 of the second ring 20 above adjacent to the first ring 10. The first holding elements 13 of the first ring 10 are located above the second supported elements 22 of the second ring 20 above adjacent to the first ring 10. As shown in the FIGS. 3A, 3B and 6B, in the stacked state, the second holding elements 23 and the arms 23a of the second ring 20 are located within the outer ring frame 11 of the first ring 10 above adjacent to the second ring 20. The second holding elements 23 of the below adjacent second ring 20 are located above the first supported elements 12 of the first ring 10 above adjacent to the second ring 20.

As shown in FIG. 5, in the stacked state, the first ring 10 and the second ring 20 are stacked such that the first supported elements 12 and the second supported elements 22 are stacked alternately. A space S1 is provided below the first supported elements 12 (between a first supported element 12 of a first ring 10 and another first supported element 12 of another first ring 10 two steps below the first ring 10). Correspondingly, a space S2 is provided below the second supported elements 22 (between a second supported element 22 of a second ring 20 and another second supported element 22 of another second ring 20 two steps below the second ring 20).

Figure 7:
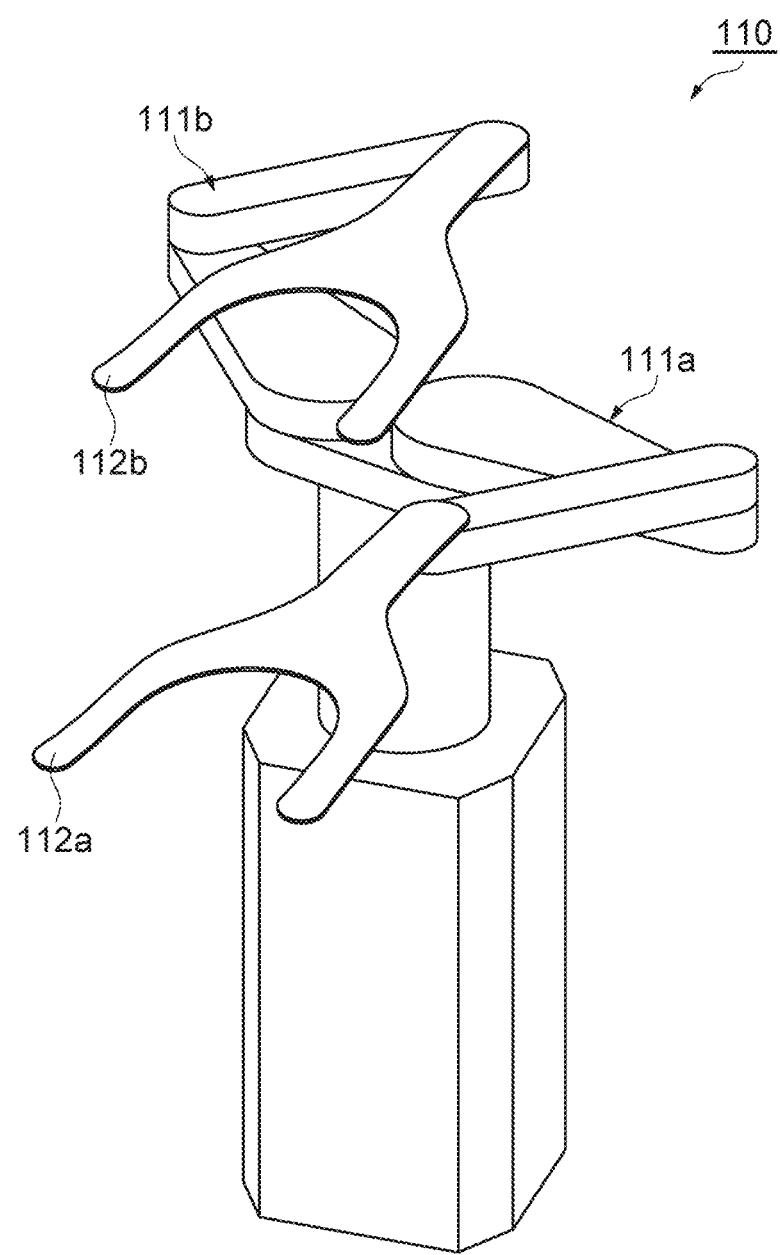
FIG. 7 is a perspective view illustrating a wafer handling robot of FIG. 1.

A wafer handling robot 110 according to a preferred embodiment shown in FIG. 7 is a delivery unit to deliver the wafer W to or from the ring 7 supported by first support pieces 141, 171 of first ring supports 140, 170 to be described later (refer to FIGS. 15A and 15B). The wafer handling robot 110 includes two robot arms 111a, 111b. The robot arms 111a and 111b are provided with slide forks 112a, 112b to scoop up and transfer the wafer W, respectively. The wafer handling robot 110 is located next to the ring opener 120 and the port 4 (refer to FIG. 1). For example, the wafer handling robot 110 or EFEM (Equipment Front End Module) is included in the delivery unit. However, any known devices may be used with no limitation.

The ring opener 120 opens a plurality of the stacked rings 7 in the vertical direction in the wafer storage container 5 in order to access these rings 7 by the wafer handling robot 110.

Figure 8:
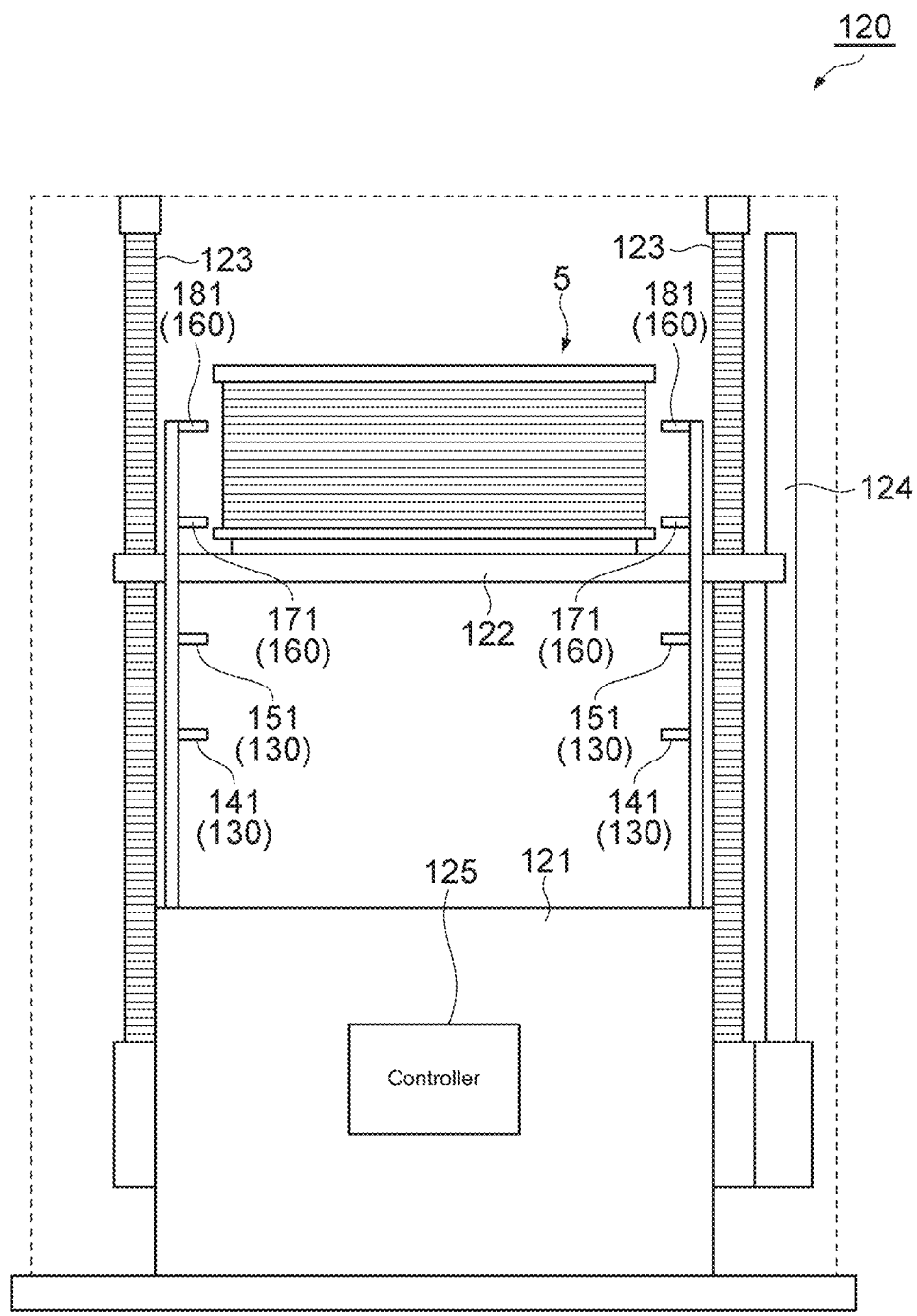
FIG. 8 is a schematic front view illustrating a ring opener of FIG. 1.
Figure 9:
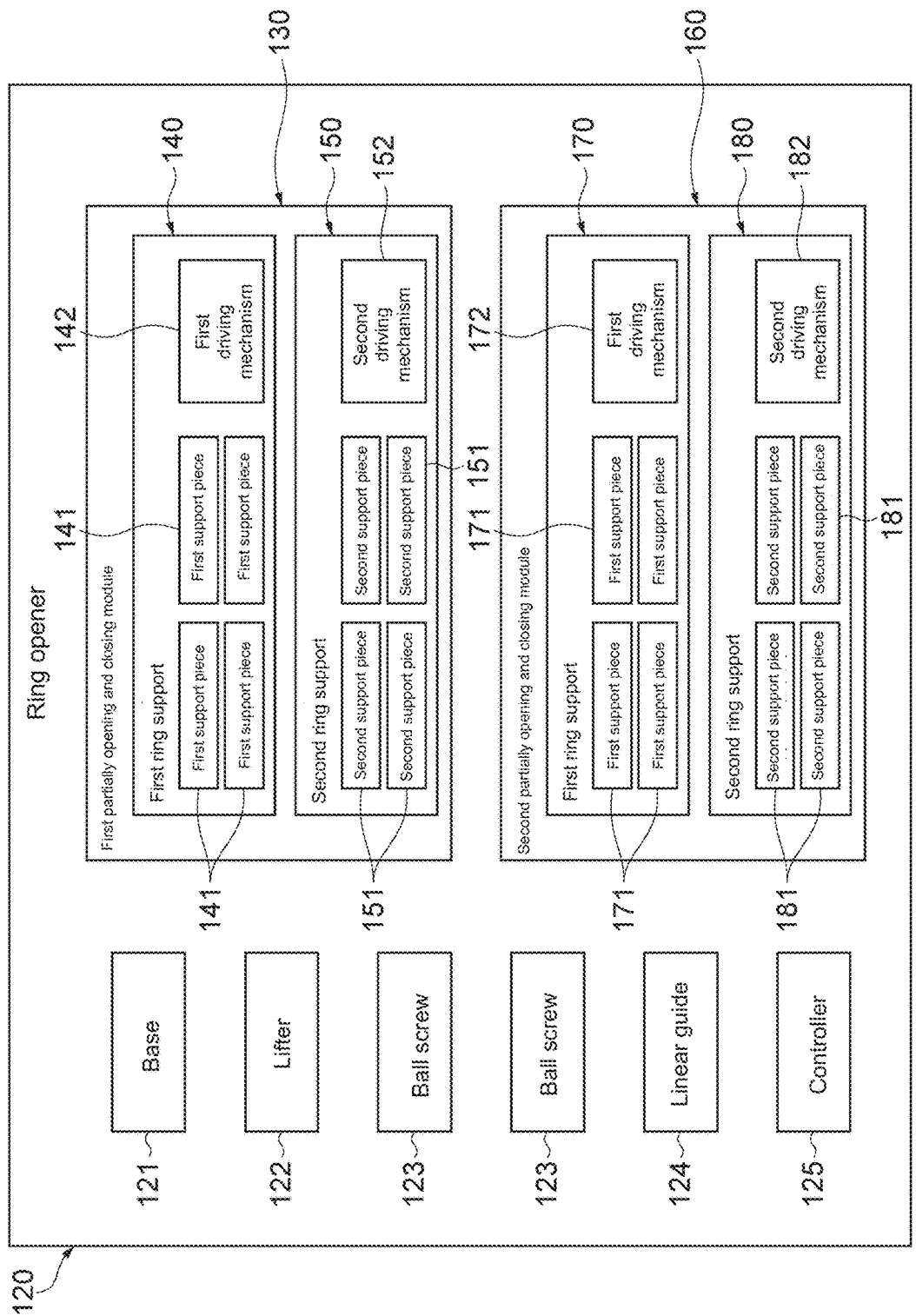
FIG. 9 is a block diagram illustrating the structure of a ring opener of FIG. 8.

Further, the ring opener closes a space between the stacked rings 7 selectively in order to stack the vertically opened rings 7 to each other at the wafer storage container 5. As shown in FIGS. 8 and 9, the ring opener 120 includes a base of ring opener 121, a lifter 122, a pair of ball screws 123, a linear guide 124, first partially opening and closing modules (partially opening and closing modules) 130, second partially opening and closing modules (partially opening and closing module) 160 and a controller 125. The base of the ring opener 121 is disposed at the bottom of the wafer delivery device. The base of the ring opener 121 accommodates various mechanisms. The base of the ring opener 121 is maintained at negative pressure in its inside, for example, with an exhaust fan. The lifter 122 is a rectangular plate-shaped elevator movable up and down above the base of the ring opener 121. The wafer storage container 5 is placed at the predetermined position on the lifter 122 by the crane 3.

The ball screws 123 are drive units to drive the lifter 122. For example, a driving mechanism to rotate the ball screws 123 around the shaft center is provided at a proximal end portion of the ball screws 123 (for example, the end portion of the side of the base of ring opener 121). Internal threads (not illustrated) integrally attached to the lifter 122 are screwed together with the ball screws 123. When the ball screws 123 are rotationally driven by the driving mechanism, the internal threads screwed together with the ball screws 123 move up and down, and the lifter 122 integral with the internal threads moves up and down. This configuration eliminates the need for the driving mechanism (driving source) to move in the vertical direction to the lifter 122. Instead of the ball screws 123, other known drive units to drive the lifter 122 may be used. The linear guide 124 to guide a vertical movement of the lifter 122 is fixed to the base of ring opener 121.

In the configuration shown in at least any of FIGS. 9 to 12, the first partially opening and closing module 130 is provided with the first ring support 140 and the second ring support 150 to support the ring 7 (refer to FIG. 9). The first ring support 140 is provided with a plurality of first support pieces 141 movable in a plan view and a first driving mechanism 142 to drive the plurality of first support pieces 141. The first support pieces 141 support one of the first ring 10 and the second ring 20. The first support piece 141 is fixed at a position in the vertical direction. The first support piece 141 is plate-shaped and provided such that the vertical direction is a direction of thickness of the first support piece 141. The first support piece 141 is supported rotatably around a drive axis 145 provided such that the vertical direction is the axial direction of the drive axis 145. The first support piece 141 includes a first claw 141x, a second claw 141y and a base plate of the support piece 141z.

The drive axis 145 is attached to the base plate of the support piece 141z. The first claw 141x, the second claw 141y, and the base plate of the support piece 141z are integral defining a unitary structure. In other words, the first claw 141x and the second claw 141y are integral and rotatably supported around the drive axis 145. The first claw 141x and the second claw 141y extend outward from the base plate of the support piece 141z in a plan view. For example, an angle between the extending direction of the first claw 141x and the extending direction of the second claws 141y is preferably about 90 or more degrees in a plan view.

The plurality of first support pieces 141 are located at four positions (four corners in a plan view) around the lifter 122. The first support pieces 141 are located at the positions close to the ring 7 of the wafer storage container 5 placed on the lifter 122. In detail, the first support pieces 141 are located at two pairs of positions facing each other across the ring 7 close to four respective corners of the ring 7 in a plan view.

The first driving mechanism 142 drives the plurality of first support pieces 141 such that the first support pieces 141 synchronously operate. As a mechanism which causes the first support pieces 141 to move in conjunction therewith by its driving force, the first driving mechanism 142 includes a first actuator 143, four first links 146, and a pair of second links 147. The first actuator 143, as a drive source, drives the first support pieces 141. The first actuator 143 is provided with a lever 143a. The distal end of the lever 143a is rotated around a drive shaft of the first actuator 143 in a plan view.

A first link 146 is coupled with each of the first support pieces 141. The first link 146 has a flexed plate shape. The first link 146 includes a vertical portion and a horizontal consecutive portion integral with the bottom edge of the vertical portion. The top edge of the vertical portion of the first link 146 is fixed to the base plate 141z of the first support piece 141. The horizontal portion of the first link 146 is rotatable about a drive axis N which is the same axis as the drive axis 145.

A pair of second links 147 is plate shaped and provided such that the vertical direction is the thickness direction. The second link 147 is coupled with two of the first links 146 via a pivot. The pair of second links 147 have a geometrically symmetric structure to each other. Each of the second links 147 includes a parallel portion and a connection portion. A pair of the parallel portions extend parallel to each other. The connection portion extends orthogonally to the parallel portion.

Both edges of each of the parallel portions of the second links 147 are coupled with the horizontal portions of the first links 146 via the pivot. In a plan view, a parallel link L is provided with the parallel portion of the second link 147 and the horizontal portion of the first link 146 (refer to FIG. 12). The connection portions of the second links 147 are overlapped with each other and the distal end of the lever 143a is slidably inserted in a long hole located at the connection portions. A scotch-yoke mechanism 148 is provided with such a pair of second links 147.

Figure 11:
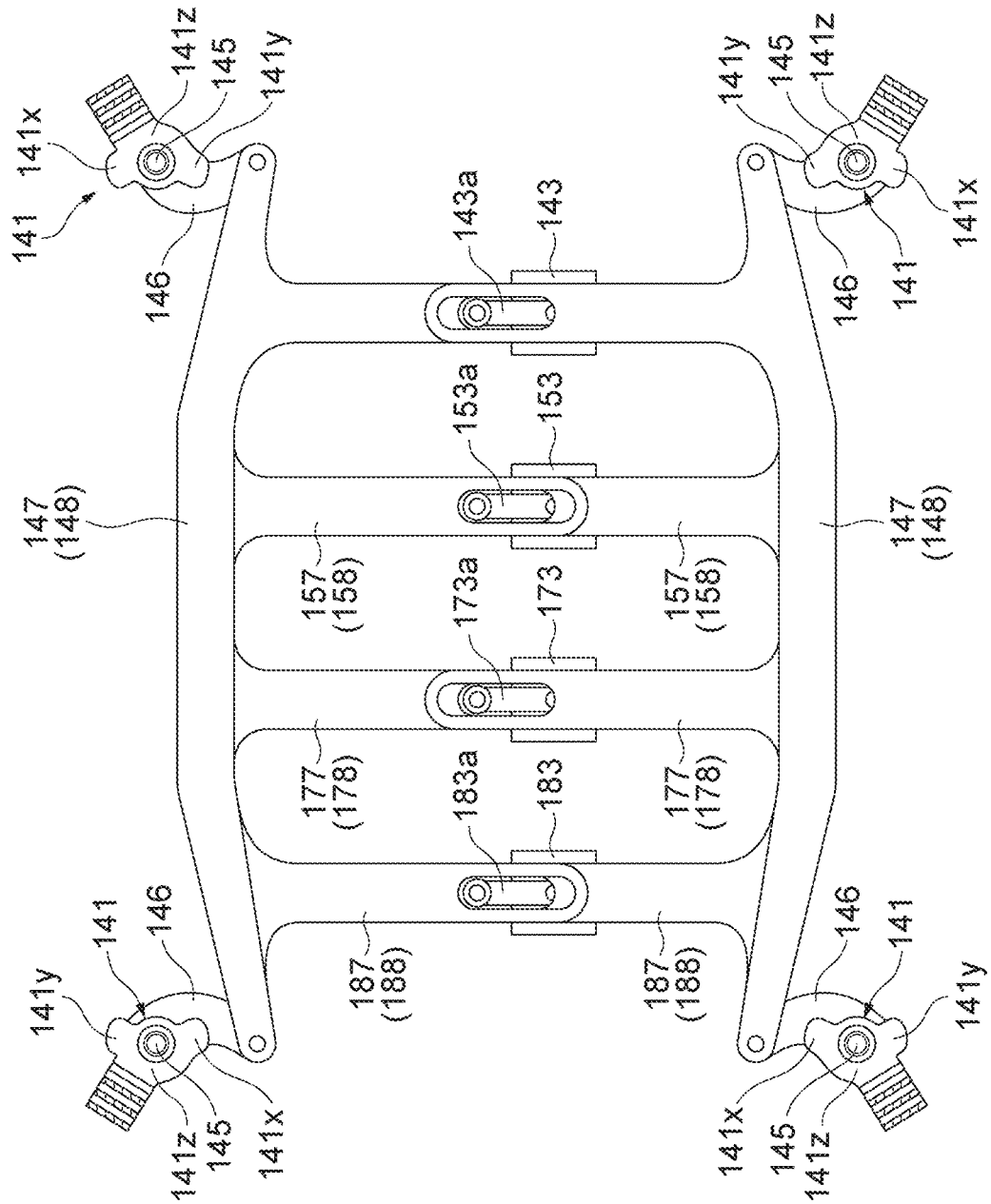
FIG. 11 is a horizontally sectional view illustrating the main portion of the ring opener of FIG. 8.
Figure 12:
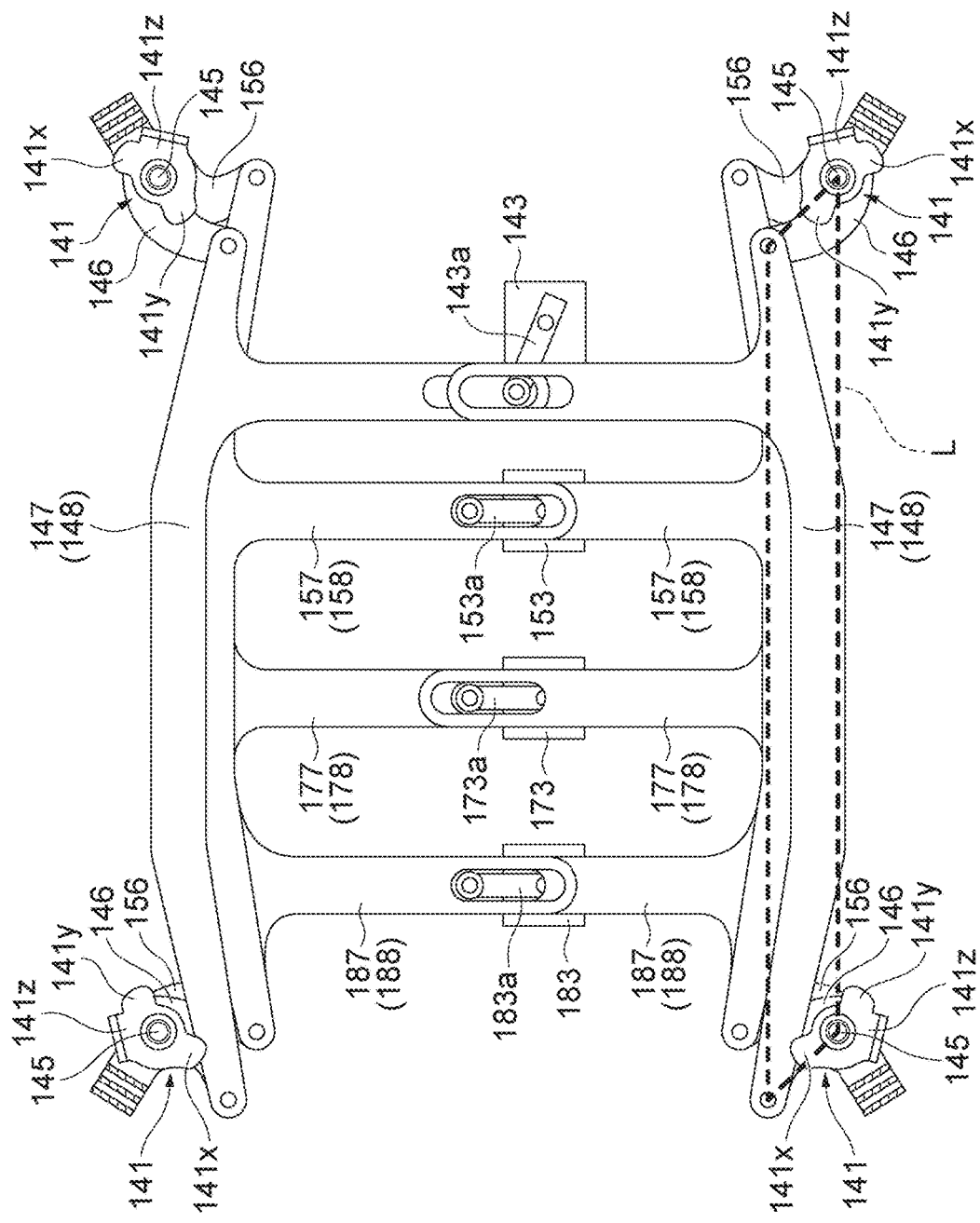
FIG. 12 is a horizontally sectional view illustrating the main portion of the ring opener of FIG. 8.
Figure 13:
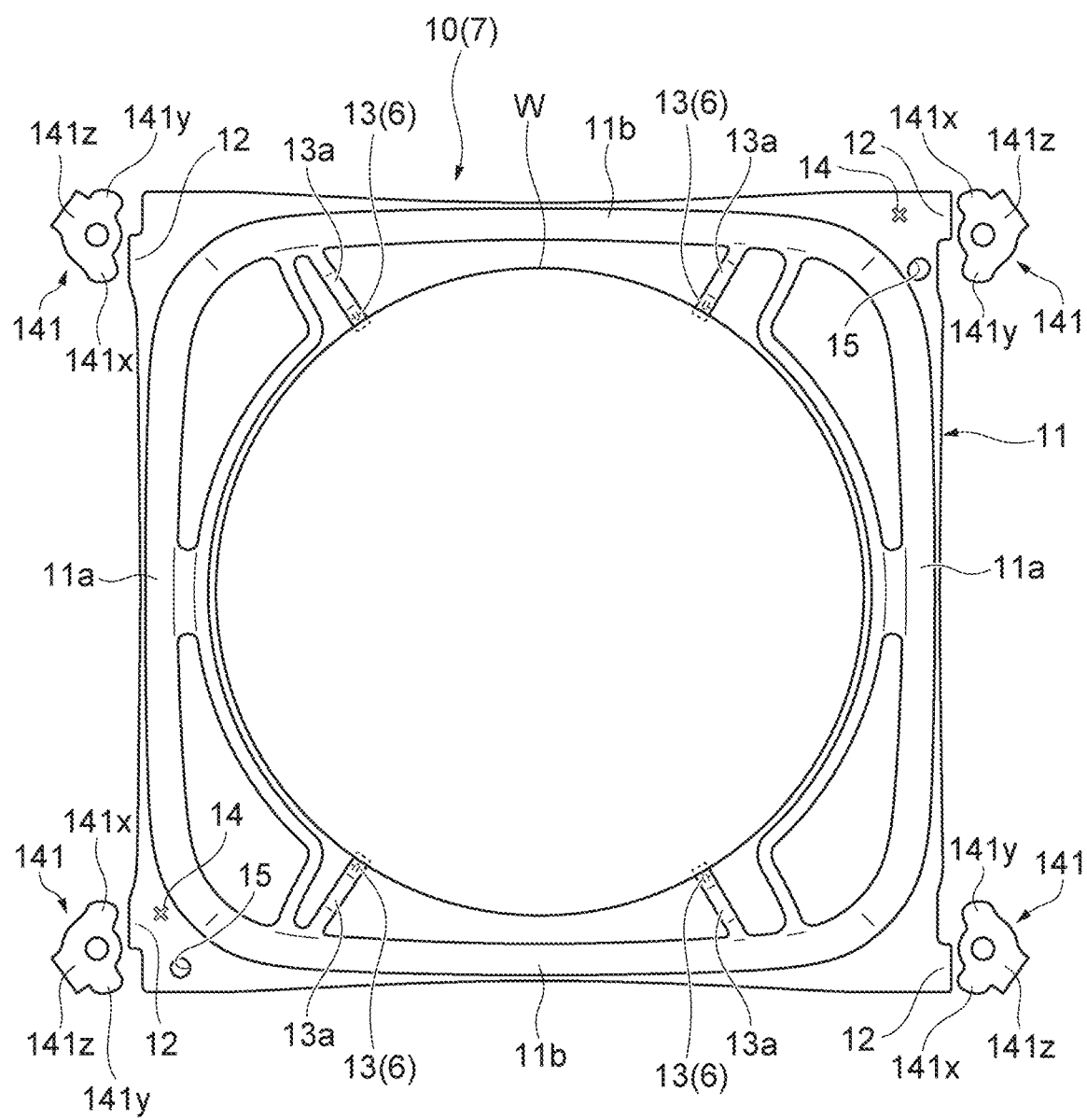
FIG. 13 is a plan view illustrating a first support piece of FIG. 8 in a neutral state.

The driving mechanism 142 is selectively switchable among a first state, a second state, and a neutral state (a third state) as shown in FIGS. 15A to 15C. For example, as shown in FIGS. 11 to 13, the third state is a neutral state in that the first support piece 141 is arranged at and retreats to the position that does not overlap with both of the first position and the second position in a plan view by movement of the lever 143a of the first actuator 143. In the neutral state, the first claw 141x does not overlap with the first position and the second position in a plan view and the second claw 141y does not overlap with the first position and the second position.

As shown in FIG. 14A, the second links 147 are moved from the neutral state via the scotch-yoke mechanism 148 in a plan view by rotating the first actuator 143 in one rotation direction. Four first links 146 rotate synchronously with each other around the drive axis N through the operation of the parallel link L, so that four first support pieces 141 rotate synchronously with each other by approximately 45 degrees around the drive axis 145. As a result, the first support pieces 141 are advanced to the position that overlaps with the first position and does not overlap with the second position in a plan view, which is the first state. In the first state, the first claw 141x overlaps with the first position in a plan view and the second claw 141y does not overlap with the first position and the second position in a plan view.

Whereas, as shown in FIGS. 12 and 14B, the second links 147 are moved from the neutral state via the scotch-yoke mechanism 148 in a plan view by rotating the first actuator 143 in the other rotation direction. The four first links 146 rotate synchronously with each other around the drive axis N through the operation of the parallel link L, so that four first support pieces 141 rotate synchronously with each other by approximately 45 degrees around the drive axis 145. As a result, the first support piece 141 is advanced to the position that overlaps with the second position and does not overlap with the first position in a plan view, which is the second state. In the second state, the second claw 141$y$ overlaps with the second position in a plan view and the first claw 141$x$ does not overlap with the first position and the second position in a plan view.

Figure 10:
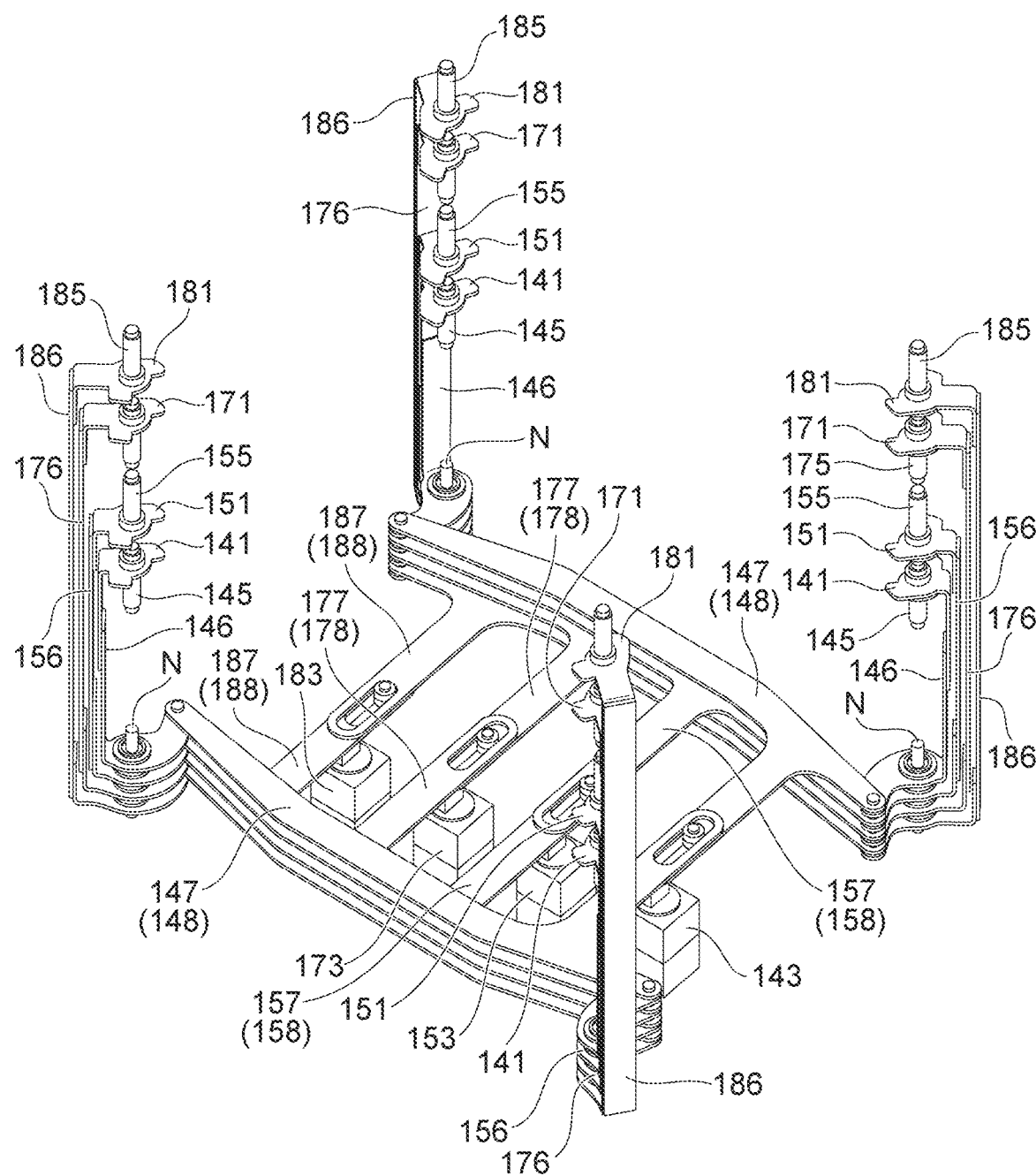
FIG. 10 is a perspective view illustrating a main portion of the ring opener of FIG. 8.
Figure 16:
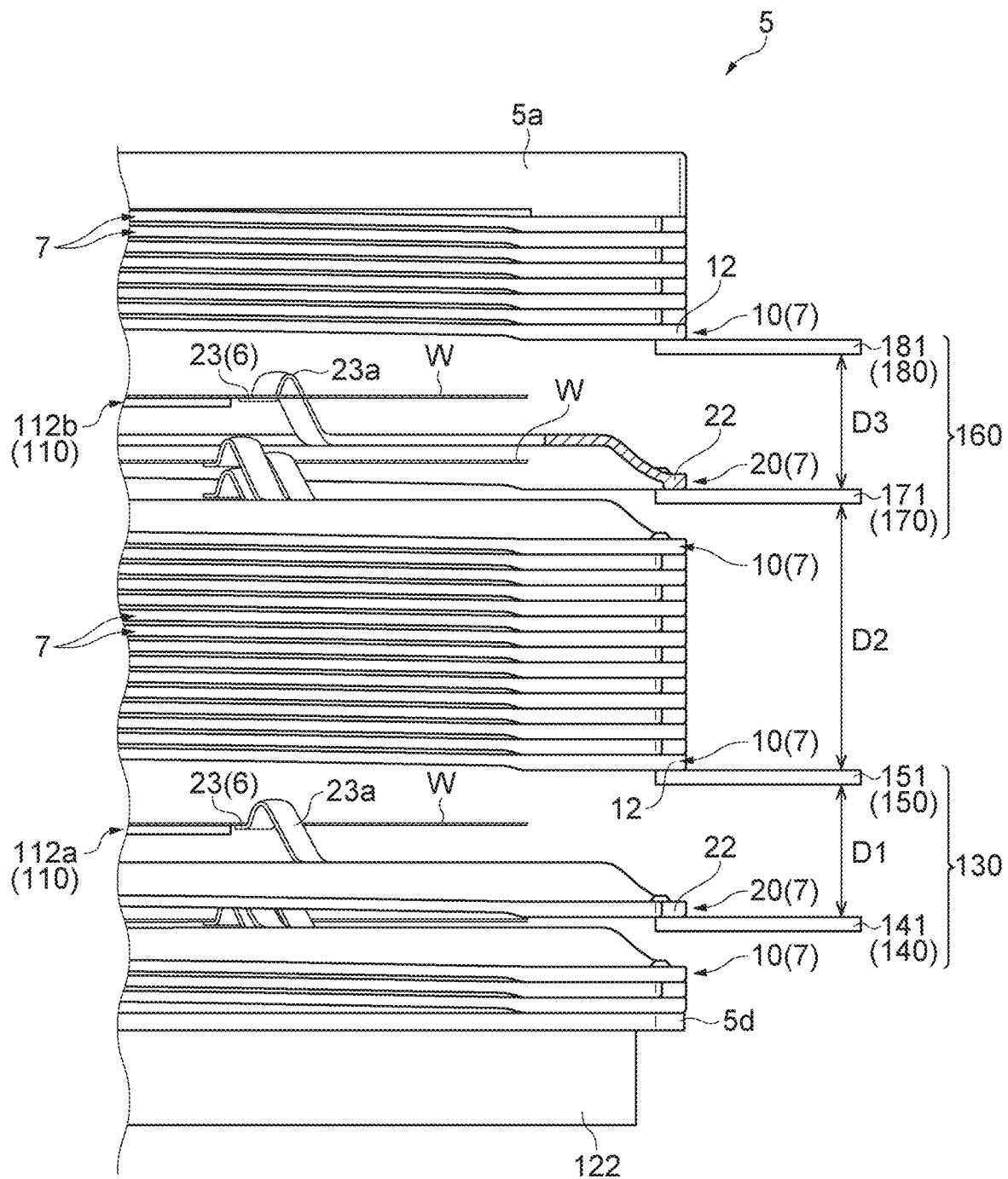
FIG. 16 is a front view explaining an operation example of the ring opener of FIG. 1

In the configuration shown in at least any of FIGS. 9 to 11, the second ring support 150 is capable of holding another ring 7 above adjacent to the ring 7 above the holding element 6 of the ring 7 held by the first ring support 140 (refer to FIG. 16). The second ring support 150 is a position setting unit to hold the bottom edge of the ring 7 above the ring 7 held by the first support piece 141 and determine the vertical position of the bottom edge of the ring 7. The second ring support 150 defines a space in which the wafer W can be delivered from/to the ring 7 by the wafer handling robot 110. The second ring support 150 includes a plurality of the second support pieces 151 movable in a plan view and a second driving mechanism 152 to drive a plurality of the second support pieces 151.

The second support piece 151 supports one of the first ring 10 and the second ring 20. The second support piece 151 is arranged above the first support piece 141 and fixed at the position in the vertical direction. The second support piece 151 has a plate shape and is provided such that the vertical direction is the thickness direction. The second support piece 151 includes a base plate of the support piece 151$z$ supported rotatably around a drive axis 155 that is the same axis as the drive axis 145

The drive axis 155 is attached to the base plate of the support piece 151$z$. A third claw 151$x$, a fourth claw 151$y$ and the base plate of the support piece 151$z$ are integral defining a unitary structure. The third claw 151$x$ and the fourth claw 151$y$ are integral and supported rotatably around the drive axis 155. In a plan view, the third claw 151$x$ and the fourth claw 151$y$ are disposed to extend from the base plate of the support piece 151$z$. For example, in a plan view, an angle between the extending direction of the third claw 151$x$ and the extending direction of the fourth claw 151$y$ preferably may be about 90 or more degrees. A plurality of the second support pieces 151 are arranged at four positions (four corners in a plan view) surrounding the lifter 122 according to the present preferred embodiment. The plurality of second support pieces 151 are arranged above the plurality of first support pieces 141, respectively.

In the configuration shown in at least any of FIGS. 9 to 11, the second driving mechanism 152 drives the plurality of second support pieces 151 such that the plurality of second support pieces 151 operate synchronously with each other. As a mechanism which causes the second support pieces 151 to move in conjunction therewith by its driving force, the second driving mechanism 152 includes the second actuator 153, four first links 156 and a pair of second links 157. The second actuator 153 structured similarly to the first actuator 143 is provided with a lever 153$a$. A scotch-yoke 158 is provided with the pair of second links 157.

As shown in FIG. 15A, in the neutral state, the second driving mechanism 152 enables the second support piece 151 to be arranged and retreated at and to the position that does not overlap with both of the first position and the second position in a plan view. In the neutral state, the third claw 151$x$ does not overlap with the first position and the second position in a plan view and the fourth claw 151$y$ does not overlap with the first position and the second position in a plan view.

As shown in FIG. 15B, in the first state, the second actuator 153 is rotated in one drive direction and the second link 157 moves on a horizontal surface via the scotch-yoke mechanism 158. Four first links 156 rotate synchronously with each other around the drive axis N in one drive direction by the operation of the parallel link L, so that four second support pieces 151 rotate synchronously with each other in one drive direction around the drive axis 155. As a result, the second support pieces 151 advance to the position that overlaps with the second position and does not overlap with the first position in a plan view. In the first state, the third claw 151$x$ overlaps with the second position in a plan view and the fourth claw 151$y$ does not overlap with the first position and the second position in a plan view. In the first partially opening and closing module 130, when the first ring support 140 reaches the first state, the second ring support 150 also reaches the first state, so that the first supported element 12 and the second supported element 22 are capable of holding the staggered rings 7 vertically adjacent to each other.

As shown in FIG. 15C, in the second state, the second actuator 153 is rotated in the other drive direction to move the second link 157 on a horizontal surface via the scotch-yoke mechanism 158. Four first links 156 rotate synchronously with each other in the other drive direction around the drive axis N by the operation of the parallel link L, so that four second support pieces 151 rotate in the other rotation direction around the drive axis 155. As a result, the second support piece 151 advances to the position that overlaps with the first position and does not overlap with the second position in a plan view. In the second state, the third claw 151$x$ does not overlap with the first position and the second position in a plan view and the fourth claw 151$y$ overlaps with the first position in a plan view.

The second partially opening and closing module 160 has a structure similar to one of the first partially opening and closing modules 130 shown in at least any of FIGS. 9 to 11. Hereinafter, with respect to the second partially opening and closing module 160, the points different from the first partially opening and closing module 130 will be described mainly while the same points will be omitted in a proper manner.

The second partially opening and closing module 160 includes the first ring support 170 and the second ring support 180 to support the ring 7 (refer to FIG. 9). The first ring support 170 supports the ring 7 different from the ring 7 supported by the first ring support 140 of the first partially opening and closing module 130. The first ring support 140 includes a plurality of the first support pieces 171 movable in a plan view and a first driving mechanism 172 to drive a plurality of the first support pieces 171.

The first support piece 171 is fixed at the position in a vertical direction. The first support piece 171 is supported rotatably around the drive axis 175 which is the same axis as the drive axis 145. A plurality of the first support pieces 171 are arranged above a plurality of the second support pieces 151, respectively. The first driving mechanism 172 includes a first actuator 173, four first links 176 and a pair of second links 177. The first actuator 173 includes a lever 173$a$. A scotch-yoke mechanism 178 is provided with the pair of second links 177. The first driving mechanism 172, in the neutral state, enables the first support piece 171 to be arranged at and retreated to the position that does not overlap with both of the first position and the second position in a plan view. In the first state, the lever 173a moves such that the first support piece 171 is arranged at the position that overlaps with the first position and does not overlap with the second position in a plan view. In the second state, the lever 173a moves such that the first support piece 171 is arranged at the position that overlaps with the second position and does not overlap with the first position in a plan view.

The second ring support 180 is capable of supporting another ring 7 above and adjacent to the ring 7 at the position above the holding element 6 of the ring 7 supported by the first ring support 170 (refer to FIG. 16). The second ring support 180 includes a plurality of the second support pieces 181 movable in a plan view and a second driving mechanism 182 to drive the plurality of second support pieces 181.

The second support piece 181 is fixed on the position in a vertical direction. The second support piece 181 is supported rotatably around a drive axis 185 which is the same axis as the drive axis 145. A plurality of the second support pieces 181 are disposed above the plurality of first support pieces 171, respectively. The second driving mechanism 182 includes a second actuator 183, four first links 186 and a pair of second links 187. The second actuator 183 includes a lever 183a. A scotch-yoke mechanism 188 is provided with the pair of second links 187. In the neutral state, the second driving mechanism 182 enables the second support piece 181 to be arranged at and retreated to the position that does not overlap with both of the first position and the second position in a plan view. In the first state, the lever 183a moves such that the second support piece 181 is arranged at the position that overlaps with the second position and that does not overlap with the first position in a plan view. In the second state, the lever 183a moves such that the second support piece 181 is arranged at the position that overlaps with the first position and does not overlap with the second position in a plan view.

As shown in FIGS. 9 and 10, the controller 125 is configured or programmed to control respective operations of the ring opener 120. The controller 125 is an electronic control unit including a Central Processing Unit (CPU), a Random Access Memory (ROM), and a Read Only Memory (RAM). The controller 125 may be made up of software in which a program stored in ROM is loaded onto RAM and carried out through the CPU. The controller 125 may also be made up of hardware such as electronic circuitry. The controller 125 may be made up of a single device or a plurality of devices. For the plurality of devices, the controller 125 is logically formed by a connection of these devices through communication network such as the Internet or an Intranet. The system controller 9 as described above may have at least some of the functions of the controller 125.

As shown in FIG. 16, a vertical space D1 between the first support piece 141 and the second support piece 151 is a space that allows the wafer W to be transferred from the ring 7 supported by the first support piece 141 by use of the wafer handling robot 110. The space D1 is a space that allows the ring 7 supported by the second support piece 151 to be positioned above the holding element 6 of the ring 7 supported by the first support piece 141. A vertical space D2 between the second support piece 151 and the first support piece 171, is a space (corresponding to the thickness of 23 pieces of the rings) that ensures that the uppermost ring 7 of 25 pieces of the stacked rings 7 is supported by the first support piece 171 and that the bottommost ring 7 is supported by the first support piece 141 in the wafer storage container 5. A vertical space D3 between the first support piece 171 and the second support piece 181 is a space that allows the wafer W to be transferred from the ring 7 supported by the first support piece 171 by use of the wafer handling robot 110. The space D3 allows the ring 7 supported by the second support piece 181 to be positioned above the holding element 6 of the ring 7 supported by the first support piece 171.

As shown in FIGS. 9 and 10, the controller 125 controls a vertical movement of the lifter 122 by controlling a drive of the ball screw 123. In addition, the controller 125 controls a drive (forward and backward movement to/from the first and second positions) of the first support pieces 141, 171 and the second support pieces 151, 181 by controlling respective operations of the actuator 143, 153, 173 and 183 in cooperation with the vertical movement of the lifter 122. The details will be described later.

An example of operation of the wafer delivery device 100 to deliver two desired wafers of the plurality of wafers W from/to the wafer storage container 5 by use of the wafer handling robot 110 will be described as follows.

Before the wafer delivering operation, the wafer storage container 5 is placed on the lifter 122 while the lifter 122 is located at the position higher than, for example, the second support piece 181 (position where, at least, the second support piece 181 is placed more highly than the bottommost ring 7). Further, the first support pieces 141, 171 and the second support pieces 151, 181 are in the neutral state separate from the first position and the second position in a plan view.

Two rings 7 (two second rings 20 illustrated in the drawings) holding two (2) wafers to be taken out are identified based on instructions from outside. For example, the height-positions of the two second rings 20 to be retrieved from a plurality of the rings 7 stacked as the wafer storage container 5 are determined and each of the predetermined height positions are recorded.

Next, the slide fork 112a of the wafer handling robot 110 moves to the predetermined height-position that allows the wafer W of the ring 7 supported by the first support piece 141 to be received. The slide fork 112b of the wafer handling robot 110 moves to the predetermined height-position that allows the wafer W of the ring 7 supported by the first support piece 171. The lifter 122 starts moving down and the wafer storage container 5 starts moving down.

When the wafer storage container 5 moves down to the height that allows the second support piece 181 to enter into the space S1 (shown in FIG. 5) below the first ring 10 adjacent to an upper portion of one second ring 20 of two second rings related to the wafer to be taken out, the second actuator 183 is controlled to move the second support piece 181. The second support piece 181 advances (or is inserted) into the space S1 and then the lifter 122 moves down. As a result, the first supported element 12 of the first ring 10 is supported by the second support piece 181.

Figure 17:
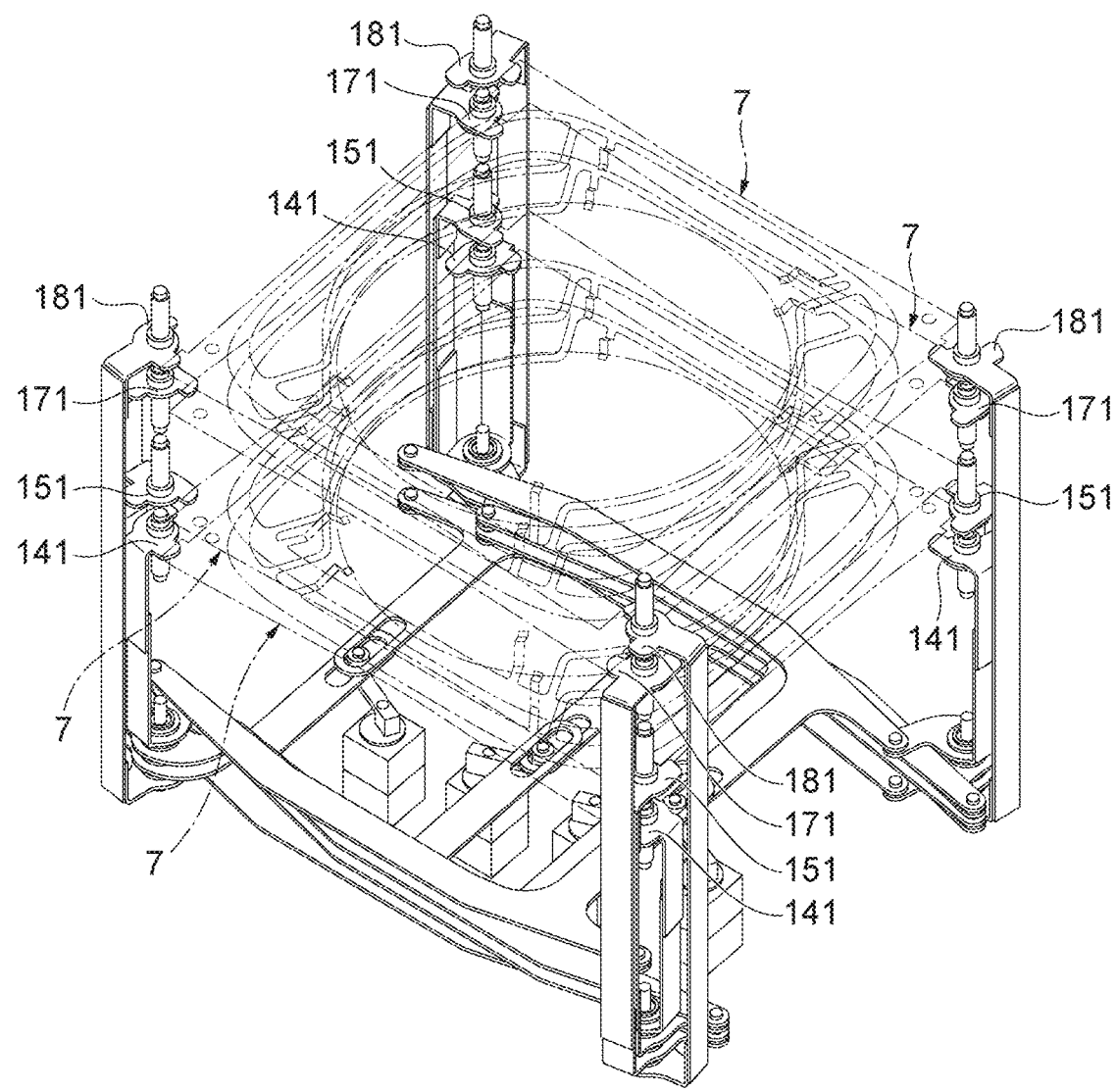
FIG. 17 is a perspective view explaining an operation example of the ring opener of FIG. 1

When the wafer storage container 5 moves down to the height that allows the first support piece 171 to enter into the space S2 (shown in FIG. 5) below the one second ring 20 of two second rings related to the wafer to be taken out, the first actuator 173 is controlled to move the first support piece 171 so that the first support piece 171 enters into the space S2 and then the lifter 122 moves down. As a result, the first supported element 12 of the first ring 10 is supported by the first support piece 171. Therefore, as shown in FIGS. 16 and 17, the second ring 20 is supported while the space between the second ring 20 and the above first ring 10 is opened in the vertical direction. The wafer W held on the second ring 20 is exposed.

When the wafer storage container 5 moves down to the height that allows the second support piece 151 to enter into the space S1 (shown in FIG. 5) below the first ring 10 adjacent to an upper portion of the other second ring 20 of two second rings related to the wafer to be taken out, the second actuator 153 is controlled to move the second support piece 151. The second support piece 151 enters into the space S1 and then the lifter 122 moves down, so that the first supported element 12 of the first ring 10 is supported by the second support piece 151.

When the wafer storage container 5 moves down to the height that allows the second support piece 141 to enter into the space S2 (shown in FIG. 5) below the other second ring 20 of two second rings related to the wafers to be taken out, the first actuator 143 is controlled to move the first support piece 141 so that the first support piece 141 enters into the space S2 and then the lifter 122 moves down, as a result, the first supported element 12 of the first ring 10 is supported by the first support piece 141. Therefore, as shown in FIGS. 16 and 17, the second ring 20 is supported while the space between the second ring 20 and the above first ring 10 is opened in the vertical direction. The wafer W held on the second ring 20 is exposed.

Next, the lifter 122 stops moving down and the wafer storage container 5 also stops moving down. The wafer W of the second ring 20 supported on the first support piece 141 is lifted up and transferred with the slide fork 112a placed at the predetermined constant height-position. The wafer W of the second ring 20 supported by the first support piece 171 is lifted up and transferred with the slide fork 112b placed at the predetermined constant height-position. Thus, delivery operations of the wafer W are completed.

An upper ring 7 adjacent to the ring 7 supported by the first ring support 140 of the first partially opening and closing module 130 may be supported by the first ring support 170 of the second partial opening and closing module 160. In this case, the second ring support 150 of the first partial opening and closing module 130 is arranged at a retreat position that does not overlap with the first position and the second position in a plan view, so that the second ring support 150 does not support the ring 7. In the case of delivering all wafers W holding the rings 7, the above described procedure may be carried out for delivery of the wafer W from/to all of the rings 7.

The wafer delivery device 100 allows the ring 7 to be supported at the same height by the first ring support 140, even if the wafer W is delivered from/to any of a plurality of the rings 7. Therefore, the wafer handling robot 110 is able to deliver the wafer W from/to any of a plurality of the rings 7 at the same height. The wafer W is delivered from/to each of the plurality of the rings 7 stacked in a vertical direction at the same height. When the wafer W is delivered from/to each of the plurality of the rings 7, the necessity to change the height of the wafer handling robot 110 can be reduced or eliminated.

The first support pieces 141, 171 of the wafer delivery device 100 according to the present preferred embodiment include the first claw 141x and the second claw 141y, respectively. The second support pieces 151, 181 of the wafer delivery device 100 according to the present preferred embodiment include the third claw 151x and the fourth claw 151y, respectively.

The first claw 141x and the second claw 141y of the wafer delivery device 100 are integral defining a unitary structure and are supported rotatably about the drive axis 145. This eliminates the need for a link mechanism and can achieve a simplified mechanism. Correspondingly, the third claw 151x and the fourth claw 151y are integral defining a unitary structure. This eliminates the need for a link mechanism and can achieve a simplified mechanism.

The ring opener 120 of the wafer delivery device 100 according to the present preferred embodiment illustrated in FIG. 9 includes first drive mechanisms 142, 172 and second drive mechanisms 152,182 in the first partial opening and closing module 130 and the second partial opening and closing module 160, respectively. For example, the ring opener 120 includes a mechanism to allow a plurality of first support pieces 141 and a plurality of first support pieces 171 to work together and move with a drive force of the first drive mechanism 142 of the first module 130 and with a drive force of the first drive mechanism 172 of the second module 160, respectively. For example, a ring opener in another preferred embodiment is not limited to this mechanism, and may include a driving mechanism combined by the first driving mechanisms 142, 172. By driving the plurality of the first support piece 141, 171 with the combined driving mechanism, the driving mechanisms 142, 172 and sensors required can be reduced. Further, reliable synchronization of the second support pieces, 151, 181 is ensured.

The second ring supports 150, 180 of the wafer delivery device 100 include the second support pieces 151, 181 and the second driving mechanisms 152, 182, respectively. In the first state, the second mechanisms 152, 182 cause the second support pieces 151, 181 to be advanced to the position that overlaps with the second position and does not overlap with the first position in a plan view. In the second state, the second mechanisms 152, 182 cause the second support pieces 151, 181 to be advanced to the position that overlaps with the first position and does not overlap with the second position in a plan view. In the third state, the second support pieces 151, 181 are arranged and retreated at the position that does not overlap with both of the first position and the second position in a plan view. In this case, a function of the second ring supports 150, 180 to support the ring 7 can be realized by the configuration that allows the second support pieces 151, 181 to advance or retreat. A function of the wafer handling robot 110 to provide a space to scoop up a wafer W can be realized by the configuration that allows the second support pieces 151, 181 to advance or retreat. The second ring supports 150, 180 of the wafer delivery device 100 include a plurality of the second support pieces 151, 181 and one second driving mechanism 152, 182, respectively. This one second driving mechanism 152, 182 includes a mechanism that allows a plurality of the second support pieces 151, 181 to work together and move with its driving force. This enables the second driving mechanisms 152, 182 to be shared for a plurality of the second support pieces 151, 181, which saves the second driving mechanisms 152, 182 required and the sensors. This enables a plurality of the second support pieces, 151, 181 to be combined and to be driven with one driving source. Reliable synchronization of the second support pieces, 151, 181 is ensured.

The wafer delivery device 100 is provided with the first partially opening and closing module 130 and the second partially opening and closing module 160. The first ring supports 140 included in the module 130 are able to support first of the plurality of stacked rings 7 and the first ring supports 170 included in the module 160 are able to support second of the plurality of stacked rings 7. With this configuration, the wafers can be delivered at multiple places and each of these positions can be fixed at a predetermined height. Further, the wafers can be delivered from/to the plurality of rings 7 at each of the predetermined height in accordance with the number of arms of the wafer handling robot 110.

The wafer storage container 5 is a container from/to which the wafer W is delivered with the wafer delivery device 100. As described above, when the wafer W is delivered from/to the wafer storage container 5 with the wafer delivery device 100, the wafer W is able to be delivered from/to each of a plurality of the rings 7 stacked in a vertical direction at the same height.

The wafer storage system 1 includes the wafer delivery device 100, the stocker 2, and the crane 3. Since the wafer delivery device 100 is in the wafer storage system 1, as described above, the wafer W is able to be delivered from/to each of plurality of the rings 7 vertically stacked at the same height.

The ring opener 120 of the wafer delivery device 100 is capable of optionally opening (partially open) one or more spaces between a plurality of the stacked rings 7. This achieves improvement of handling time and reduction in height in comparison with a case of opening all rings 7. The number of spaces to be opened depends on the number of the arms of the wafer handling robot 110, so that the time for waiting without any operations of the wafer handling robot 110 can be reduced.

In addition, even if only a few wafers W are delivered from/to FOUP 8, a decrease in handling efficiency can be prevented.

Therefore, if the wafers W are dummy wafers, only several pieces of the wafers are quickly taken in and out many times. This remarkably shows the advantageous effect described above. The dummy wafer is used to be inspected in the device and reused (transferred between the wafer storage container 5 and FOUP 8) many times while degrading its quality gradually.

As shown in FIG. 10, the vertical portions of the first links 146, 156, 176, and 186 coupled with the support pieces 141, 151, 171, and 181, respectively have a nested structure, which reduces a storage space. The actuators 143, 153, 173, and 183, the second links 147, 157, 177, and 187, and the scotch yoke mechanisms 148, 158, 178, and 188 are capable of being collected into the base of ring opener 121 and quarantined. This reduces concerns about dust generation, and thus reduces or minimizes the impact of dust on the wafer W.

Each of a plurality of stacked rings 7 is thin. When the vertically adjacent rings 7 are supported by support pieces at the same position in a plan view, supported elements supported by the support pieces are inevitably thinned, so that this may not obtain an enough strength. Whereas, when the supported elements supported by support pieces becomes thick in order to obtain an enough strength, each of the rings 7 also becomes thick, which causes a new damage such that the vertical dimension of the wafer storage container 5 becomes large. In the wafer storage container 5 according to the present preferred embodiment of the present invention, however, the first ring 10 and the second ring 20 including the first supported element 12 and the second supported element 22 staggered in a plan view, respectively are alternately stacked, so that the space S1 and S2 can be provided directly below the first supported element 12 and the second supported element 22 of the ring 7 (refer to FIG. 5). Therefore, the use of the spaces S1, S2 enables each of support pieces 141, 151, 171 and 181 to ensure an easy entrance into between two rings 7.

As the above, the preferred embodiments of the present invention have been described. However, preferred embodiments of the present invention are not limited to the above preferred embodiments and can be changed variously.

In the above preferred embodiments, the lifter 122 is moved up and down by the ball screw 123. However, a device for moving the lifter 122 up and down is not particularly limited, preferably, the lifter 122 may be moved up and down by a belt mechanism. In the above preferable embodiments, the ring 7 is supported by the second ring supports 150, 180. Alternatively, the ring may be supported by a supporter having a well-known structure other than the above structure.

In the above-described preferred embodiments, each of first driving mechanisms 142, 172 drives a plurality of the first support pieces 141, 171, but it is not limited thereto. The ring opener 120 may include a plurality of the first driving mechanisms, each of which may drive each of a plurality of the first support pieces. Correspondingly, in the above-described preferred embodiments, each of second driving mechanisms 152, 182 drives a plurality of the second support pieces 151, 181, but it is not limited thereto. The ring opener 120 may include a plurality of the second driving mechanisms, each of which may drive each of a plurality of the second support pieces.

Figure 18:
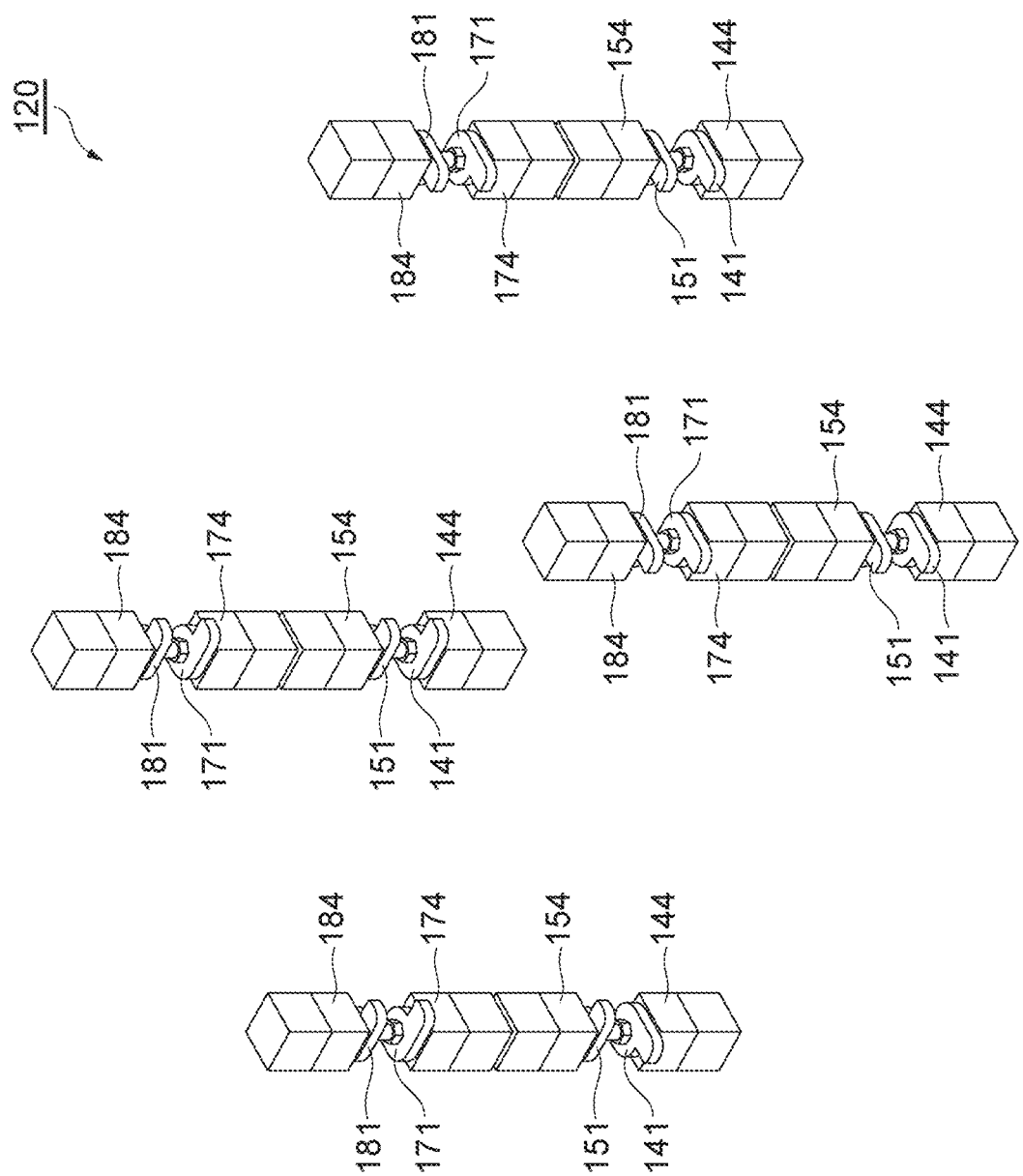
FIG. 18 is a perspective view illustrating the main portion of the ring opener according to a variation of a preferred embodiment of the present invention.

For example, as shown in FIG. 18, instead of the first driving mechanism 142 (refer to FIG. 9), the ring opener 120 may include four first driving mechanisms 144 such as an actuator. The driving shafts of the first driving mechanisms 144 are directly coupled with the first support pieces 141, respectively. Instead of the second driving mechanism 152 (refer to FIG. 9), the ring opener 120 may include four second driving mechanisms 154 such as an actuator. The driving shafts of the second driving mechanisms 154 are directly coupled with the second support pieces 151, respectively. Instead of the first driving mechanism 172 (refer to FIG. 9), the ring opener 120 may include four first driving mechanisms 174 such as an actuator. The driving shafts of the first driving mechanisms 174 are directly coupled with the first support pieces 171, respectively. Instead of the second driving mechanism 182 (refer to FIG. 9), the ring opener 120 may include four second driving mechanisms 184 such as an actuator. The driving shafts of the second driving mechanisms 184 are directly coupled with the second support pieces 181, respectively.

This configuration enables the first support pieces 141 placed at four corners to work together controllably with the actuators or the like, without working together mechanically. This configuration enables the first support pieces 171 placed at four corners to work together controllably with the actuators or the like, without working together mechanically. This configuration enables the second support pieces 151 placed at four corners to work together controllably with the actuators or the like, without working together mechanically. This configuration enables the second support pieces 181 placed at four corners to work together controllably with the actuators or the like, without working together mechanically. Therefore, this configuration can achieve a simplified mechanism without any link mechanism. Mass production of the same structures can improve the assembly process.

In the above-described preferred embodiments, the wafer handling robot 110 includes two robot arms 111*a*, 111*b*. However, the number of the arms is not limited to two. One or three or more arms may be included. The ring opener 120 opens or closes the spaces between a plurality of the stacked rings 7 depending on the number of arms. That is, the number of the partial opening and closing modules provided depends on the number of arms. In other words, the same number of the delivery unit as the number of arms depending on the number of the partial opening and closing modules (the number of opened or closed spaces) may be provided.

In the above-described preferred embodiments, the first support pieces 141, 171 include two claws, however, may include one claw. The second support pieces 151, 181 include two claws, however may include one claw. With this configuration, a claw is moved so as to overlap with either of the first position and the second position in a plan view.

In the above-described preferred embodiments, the first claw 141x and the second claw 141y are integral defining a unitary structure. However, they may be separate and independent structures. For example, as shown FIG. 19A, instead of the first support piece 141 (refer to FIG. 11), a first support piece 149a may be provided. The first support piece 149a includes a first claw 149b, a second claw 149c and a link mechanism 149d. The first claw 149b is rotatable about an axis G1. The second claw 149c is made up of a different component from one of the first claw 149b and rotatable around an axis G2. The link mechanism 149d links the first claw 149b to the second claw 149c together. For example, as shown FIG. 19B, instead of the first support piece 141 (refer to FIG. 11), the first support piece 149e may be provided. The first support piece 149e includes a first claw 149f, a second claw 149g and a link mechanism 149h. The first claw 149f is rotatable about an axis G3. The second claw 149g is made up of a different component from one of the first claw 149f and rotatable about an axis G4. The link mechanism 149h links the first claw 149f to the second claw 149g together. The first claw 149f and the second claw 149g are disposed so as to partially overlap with each other.

Each of the first claw 149b and the second claw 149c is separate and capable of being independently advanced and retreated by the link mechanism 149d. Each of the first claw 149f and the second claw 149g is separate and capable of being advanced and retreated by the link mechanism 149h. This easily avoids interference of the first claw 149b, 149f and the second claw 149c, 149g with other components. Further, use of such a method that allows the first claws 149b, 149f and the second claws 149c, 149g to work together by the link mechanisms 149d, 149h enables the first claws 149b, 149f and the second claws 149c, 149g to enter into the spaces S1, S2 of the rings 7 with larger radius. This can eliminate chamfering for avoiding the interference.

In the above-described preferred embodiments, the third claw 151x and the fourth claw 151y are integral defining a unitary structure. However, as with the first claw 149b, 149f and the second claw 149c, 149g as described above, the third claw and the fourth claw may be separate and independent elements. This configuration easily avoids interference between the third claw and the fourth claw with other components, which can eliminate chamfering for avoiding interference.

In the above-described preferred embodiments, the first position of the first supported element 12 of the first ring 10 in a plan view is not particularly limited. Similarly, the second position of the second supported element 22 of the second ring 20 in a plan view is not particularly limited. The first position and the second position may be different from each other in a plan view. Each structure of the above-described preferred embodiments and the above variations may be combined in a proper manner. Any of the preferred embodiments of the present invention can be changed without departing from the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A wafer delivery device to deliver wafers to or from a wafer storage container including a plurality of rings including a wafer holding element to hold a wafer, the plurality of rings including a first ring including a first supported element at a first position in a plan view and a first wafer holding element to hold the wafer above the first supported element, and a second ring including a second supported element at a second position different from the first position in a plan view and a second wafer holding element to hold the wafer above the second supported element, the first ring and the second ring are stacked alternately and vertically, and the first wafer holding element of the first ring is located above the second supported element of the second ring located above and adjacent to the first ring and the second wafer holding element of the second ring is located above the first supported element of the first ring located above and adjacent to the second ring, the wafer delivery device comprising:
a first ring support to support a ring of the plurality of rings;
a second ring support to support another ring of the plurality of rings located above and adjacent to the ring at a position above the wafer holding element of the ring supported with the first ring support;
an elevating platform on which the wafer storage container is to be placed and is vertically movable; and
a wafer delivery device to deliver the wafer to or from the ring supported with the first ring support; wherein
the first ring support includes:
a first support piece fixed at a position in a vertical direction and movable in a plan view; and
a first driving mechanism to drive the first support piece;
the first driving mechanism is selectively switchable among any of three states including:
a first state of the first support piece being advanced to a position overlapping with the first position and not overlapping with the second position in a plan view;
a second state of the first support piece being advanced to a position overlapping with the second position and not overlapping with the first position in a plan view; and
a third state of the first support piece being retreated to a position not overlapping with the first and second positions in a plan view.

2. The wafer delivery device according to claim 1, wherein the first support piece includes:
a first claw overlapping with the first position in a plan view in the first state and not overlapping with the first position in a plan view in the second state; and
a second claw being disposed at a same position as the first claw in a vertical direction, and not overlapping with the second position in a plan view in the first state and overlapping with the second position in a plan view in the second state.

3. The wafer delivery device according to claim 2, wherein the first claw and the second claw are integral defining a unitary structure and supported rotatably about a drive axis.

4. The wafer delivery device according to claim 2, wherein the first claw and the second claw are separate structures to be independently advanced and retreated by a link mechanism.

5. The wafer delivery device according to claim 1, wherein
   the first ring support includes a plurality of the first support pieces and a single one of the first driving mechanism; and
   the first driving mechanism includes a mechanism to cause a plurality of the first support pieces to work together and move in response to a driving force from the first driving mechanism.

6. The wafer delivery device according to claim 1, wherein
   the first ring support includes a plurality of the first support pieces and a plurality of the first driving mechanisms; and
   each of a plurality of the first driving mechanisms drives each of a plurality of the first support pieces.

7. The wafer delivery device according to claim 1, wherein
   the second ring support includes:
   a second support piece above the first support piece and movable in a plan view; and
   a second driving mechanism to drive the second support piece; wherein
   the second driving mechanism causes the second support piece to advance to a position that overlaps with the second position and does not overlap with the first position in the first state in a plan view, the second driving mechanism causes the second support piece to advance to a position that overlaps with the first position and does not overlap with the second position in the second state in a plan view, and the second driving mechanism causes the second support piece to retreat to a position that does not overlap with the first position and the second position in the third state in a plan view.

8. The wafer delivery device according to claim 7, wherein the second support piece includes:
   a third claw that overlaps with the second position in a plan view in the first state; and
   a fourth claw located at a same position as the third claw in a vertical direction and that overlaps with the first position in a plan view in the second state.

9. The wafer delivery device according to claim 8, wherein the third claw and the fourth claw are integral defining a unitary structure and supported rotatably about a drive axis.

10. The wafer delivery device according to claim 8, wherein the third claw and the fourth claw are separate structures to be independently advanced and retreated by a link mechanism.

11. The wafer delivery device according to claim 7, wherein
    the second ring support includes a plurality of the second support pieces, and a single one of the second driving mechanism; and
    the second driving mechanism includes a mechanism that allows a plurality of the second support pieces to work together and move in response to a driving force from the second driving mechanism.

12. The wafer delivery device according to claim 7, wherein
    the second ring support includes a plurality of the second support pieces and a plurality of the second driving mechanisms; and
    each of the plurality of second driving mechanisms drives each of the plurality of second support pieces.

13. The wafer delivery device according to claim 1, further comprising a plurality of partially opening and closing modules including the first and second ring supports; wherein
    each of the first ring supports included in each of the plurality of partially opening and closing modules is able to support any different rings of the plurality of stacked rings.

14. A wafer storage system comprising:
    the wafer delivery device according to claim 1;
    a stocker to store the wafer storage container; and
    a crane to move the wafer storage container between the stocker and the wafer delivery device.

* * * * *